United States Patent [19]

Nakanishi et al.

[11] Patent Number: 5,786,641
[45] Date of Patent: Jul. 28, 1998

[54] FAILURE DETECTION SYSTEM FOR DETECTING A FAILURE IN A POWER CONVERTER

[75] Inventors: Makoto Nakanishi; Katsumi Ikeda, both of Tokyo, Japan

[73] Assignee: Mitsubishi Denki Kabushiki Kaisha, Tokyo, Japan

[21] Appl. No.: 597,153

[22] Filed: Feb. 6, 1996

[30] Foreign Application Priority Data

Feb. 7, 1995 [JP] Japan .................. 7-019505

[51] Int. Cl.⁶ .................................................. H02J 7/00
[52] U.S. Cl. .................... 307/64; 307/85; 307/131; 364/492; 361/79; 361/86
[58] Field of Search .................. 361/78, 79, 86, 361/87; 307/64, 66, 85, 86, 87, 112, 113, 116, 125, 130, 131, 43; 364/492, 480

[56] References Cited

U.S. PATENT DOCUMENTS

| | | | |
|---|---|---|---|
| 4,475,047 | 10/1984 | Ebert, Jr. ................. | 307/66 |
| 4,763,013 | 8/1988 | Gvoth, Jr. et al. ......... | 307/66 |
| 5,422,518 | 6/1995 | Sashida .................. | 307/75 |
| 5,555,151 | 9/1996 | Baker et al. ............. | 361/79 |
| 5,612,580 | 3/1997 | Janonis et al. ........... | 307/64 |

FOREIGN PATENT DOCUMENTS 5268734  10/1993  Japan .

*Primary Examiner*—William M. Shoop, Jr.
*Assistant Examiner*—Jonathan S. Kaplan
*Attorney, Agent, or Firm*—Leydig, Voit & Mayer, Ltd.

[57] ABSTRACT

A failure detection system detects a failure in a by-pass switch of a power converter. The by-pass switch switches the electric power supply so that electric power is supplied from a standby power source to a load instead of from a power converter. A switch operation circuit turns the by-pass switch on and off. A first current detector detects the inverted output current of the power converter. A second current detector detects the load current flowing through the load. An operational amplifier adds the outputs of the first and second current detectors. A comparator detects a failure of the by-pass switch. If the addition result given by the operational amplifier is outside a predetermined range of values when the switch operation circuit is turned off, the comparator concludes that the by-pass switch has a failure. In this failure detection system, it is possible to detect a failure of the by-pass switch used to transfer the electric power to the load from the standby power source instead of from the power converter, without having to detect the current flowing through the by-pass switch. Thus, it is possible to reduce the size and the cost of the system.

14 Claims, 14 Drawing Sheets

5,786,641

FAILURE DETECTION SYSTEM FOR DETECTING A FAILURE IN A POWER CONVERTER

BACKGROUND OF THE INVENTION

1. Field of the Invention

The present invention relates to a failure detection system for detecting a failure in a power converter constituting uninterruptible power equipment provided with a by-pass switch.

2. Description of the Related Art

FIG. 13 is a single-line type diagram illustrating a power converter provided with a by-pass switch, disclosed in Japanese Patent Laid-Open No. 5-268734 (1988). In this figure, the power converter (inverter) 1 converts DC power received from a battery (not shown) to AC voltage VA and outputs the resultant AC voltage VA.

As shown in FIG. 14, the power converter 1 is composed of commutating diodes D1 to D4 connected in such a manner to form a full bridge circuit wherein each commutating diode D1–D4 is connected in parallel to a corresponding switching device S1–S4.

The AC voltage VA output from the power converter 1 is applied to a filter composed of a reactor 2 and a capacitor 3 via a current sensor 601 which the inverter current IA Harmonic components contained in the carrier signal are removed the filter. After passing through the filter, the AC voltage VA is supplied to a load 4 via a contactor 5 and a current sensor 603 for detecting the load current IL. After passing through the contactor 5, the inverter output voltage VS is detected by a voltage sensor 604. An inverter loop is formed with the circuit elements described above.

If a failure or overload occurs in the power converter 1, power is supplied to the load from a standby power source 9 instead of the power converter 1. The AC voltage from the standby power source 9 is supplied to the load 4 after passing through a no-fuse breaker 8, a current sensor 600 for detecting the by-pass current IS, and finally the current sensor 603. The by-pass switch 6 comprises thyristors 6a and 6b connected in anti parallel to each other and also comprises a contactor 7 connected in parallel to the thyristors 6a and 6b. A by-pass loop is formed with the circuit elements described above.

The power converter 1 is controlled by a control circuit comprising: a sinusoidal AC reference voltage generator 901 for generating a sinusoidal AC reference voltage (target inverter voltage) $E \sin \omega t (= Vc^*)$; a target current value generator 902 for generating a target AC reference current value (capacitor current) $Ic^* = \omega CpE \cos \omega t$ to be passed into a capacitor 3 wherein the target AC reference current value is ahead in phase by 90° relative to the sinusoidal AC reference voltage $E \sin \omega t$; a clock generator 903 for generating a clock signal used as the time base according to which the output signals of these generators 901 and 902 are generated; and a voltage controlling amplifier 910 for amplifying the deviation of the inverter output voltage VS from the target inverter voltage Vc* wherein the deviation is obtained through an adder 911.

The control circuit of the power converter 1 further comprises: an adder 911 used to obtain the sum of the load current IL, target AC reference current value Ic*, and the amplified signal Jc of the target inverter voltage Vc* and output a target inverter current IA*; a limiter 905 for limiting the target inverter current IA* to a value within the range allowed for the inverter 1; and a current controlling amplifier 906 for amplifying the deviation, obtained via the adder 912, of the inverter current IA from the target inverter current IA* wherein the resultant output signal IE1 of the current controlling amplifier 906 is applied to a PWM modulator 908.

The PWM modulator 908 is constructed, as shown in FIG. 15, with a carrier generator 908b and a comparator 908a so that the output signal IE1 of the current controlling amplifier 906 is compared with a triangular waveform CA having a frequency of about 1 to 2 kHz generated by the carrier generator 908b and the comparison result is output as the PWM modulation signal PWMO to the switching devices S1 to S4 constituting the power converter 1.

There is provided a failure detection circuit for detecting a failure of the by-pass switch 6 wherein the failure detection circuit includes an OR gate 807 for determining a logical OR between the logical-level signals output from comparators 812a and 812b and outputting the result. The by-pass current IS flowing through the by-pass switch 6 is converted into a voltage value (referred to as a by-pass voltage) Ve and applied as a comparison value to the comparison voltage input terminal of each comparator 812a and 812b.

A positive reference voltage VRA (+VSE) generated by a reference voltage generator 813a is applied to the reference voltage input terminal of the comparator 812a while a negative reference voltage VRB (−VSE) generated by a reference voltage generator 813b is applied to the reference voltage input terminal of the comparator 812b. The logical AND between the logic-level signal output from the OR gate 807 and a logic-level signal output by a by-pass switch controlling circuit 821 is determined by an AND gate 820.

The failure detection circuit of the by-pass switch 6 also includes a one-shot multivibrator 840 which operates in response to a high-level signal generated by the AND gate 820 and outputs a pulse signal which is applied to the base of a transistor 841 at the succeeding stage. If the transistor 841 turns on in response to the above pulse signal, an excitation current is supplied from a DC power source 843 into the shunt trip coil 841 of the no-fuse breaker CB1 connected to the collector. As a result, the shunt trip coil is activated and thus no-fuse breaker CB1 is shut off.

The conventional failure detection system shown in FIG. 13 detects a failure in the power converter in such a manner described below. Before describing the operation of the failure detection system, the operation of the control circuit of the inverter (power converter) 1 will be described first. The control circuit includes a current minor loop for performing instantaneous current control in the power conversion operation and also includes a voltage control loop for performing rather slow control in the power conversion operation. The control circuit of the inverter 1 determines a target inverter current IA* which should be passed through the inverter 1 to generate the AC voltage VA. The inverter current IA is instantaneously controlled to the above target value via the current minor loop so that the AC voltage VA corresponds to the target inverter voltage VC*.

The operation of the current minor loop will be described in greater detail below. The adder 912 determines the deviation of the inverter current IA detected by the current sensor 601 from the target inverter current IA* which should be passed through the inverter 1 so as to output the AC voltage VA having the required value. The detected deviation is amplified by the current controlling amplifier 906, and the resultant deviation signal is applied as the output signal IE1 to the PWM modulator 908. The PWM modulation signal PWM0 output from the PWM modulator 908 is applied to the inverter 1 thereby controlling it in the PWM fashion.

The target inverter current IA* is determined as follows. The inverter 1 is required to provide an output current equal to the sum of the load current IL and the capacitor current Ic flowing through a capacitor 3. Thus the target inverter current IA* equals to the sum of the target capacitor current IC* given as the output of the target capacitance current generator 902 and the load current IL detected by the current sensor 603 which is added further with the correction value Jc via the adder 911 so that the voltage deviation (the deviation of the inverter output voltage VS from the target inverter voltage VC*) is minimized wherein the result is limited by the limiter 905 to a value less than the maximum allowable current. The obtained target inverter current IA* is used as the reference of the current in the current minor loop.

On the other hand, the voltage control loop operates as follows. To correct the deviation of the inverter output voltage VS from the sinusoidal waveform due to the fluctuations of load 4 or uncertain factors and thus to achieve a stable operation in the control system, the deviation of the inverter output voltage VS detected by the voltage sensor 604 from the target inverter voltage VC* given as the output of the adder 909 is amplified by the voltage controlling amplifier 910, and the amplified deviation signal is added as the correction signal Jc to the target inverter current IA*.

Now, the operation of the failure detection circuit of the by-pass switch 6 will be described below. When the load 4 is driven by the inverter 1, no AC power is supplied to the load 4 from the standby power source 9 and therefore the by-pass switch 6 is normally in an off state. However, if a by-pass current IS flows between the standby power source 9 and the inverter 1 via the no-fuse breaker 8 and the by-pass switch 6 although the by-pass switch 6 is in the off state, then the by-pass switch 6 is regarded to have a failure and thus the no-fuse breaker 8 is shut off so that the by-pass switch 6 is protected and an operator is guarded from an electrical shock which would otherwise occur when the operator touches an active terminal of the no-fuse breaker 8.

The operation of failure detection circuit will be described in further detail below. If the by-pass switch controlling circuit 821 has performed an operation for turning off the by-pass switch 6, a low-level signal is output from the by-pass switch controlling circuit 821 and applied to the negative-logic input terminal of the AND gate 820. In this state, the by-pass current IS is detected by the current sensor 600 and converted to the by-pass voltage Ve which is in turn applied to the comparison voltage input terminal of the comparators 812a and 812b.

A positive reference voltage VRA is supplied from the reference voltage generator 813a to the reference voltage input terminal of the comparator 812a, while a negative reference voltage VRB is supplied from the reference voltage generator 813b to the reference voltage input terminal of the comparator 812b. The comparators 812a and 812b compare the received by-pass voltage Ve with the reference voltages VRA and VRB, respectively. The comparison result is output in the form of a logical-level signal from each comparator 812a and 812b to the OR gate 807.

The OR gate 807 determines the logical OR between the received signals and supplies the result in the form of a logical-level signal to the AND gate 820. The AND gate 820 determines the logical AND between the above received signal and the low-level signal given from the by-pass switch controlling circuit 821. In this situation, if the output of the OR gate 807 is at a high level, then the AND gate 820 outputs a high-level signal to the one-shot multivibrator 840 which in turn outputs a pulse signal having a predetermined width to the base of the transistor 841.

In response to the pulse signal, the transistor 841 turns on, and thus an excitation current is supplied from the DC power source 843 into the shunt trip coil 842 connected to the collector thereby activating the shunt trip coil 842 and thus shutting off the no-fuse breaker 8 disposed in the by-pass loop.

The reference voltage generators 813a and 813b generate positive and negative voltages $\leq$ VSE (VSE>0) taking into the account the error of the current sensor 600, and these voltages +VSE (=VRA) and -VSE (=VRB) are used as the reference voltages applied to the comparators 812a and 812b, respectively. Therefore, if the by-pass switch 6 is in an off state having no failure and thus if no by-pass current IS flows through either the current sensor 600 or the by-pass switch 6, then the by-pass voltage Ve has a value between the reference voltages VRA and VRB, that is, VRA>Ve>VRB. As a result, the output signals of both the comparators 812a and 812b are at a low level, which are applied to the OR gate 807. Thus, the OR gate 807 outputs a low-level signal, which is applied to the AND gate 820. As a result, no operation occurs in the one-shot multivibrator 840 and the succeeding transistor 841 remains in the off state and thus the no-fuse breaker 8 also remains in the closed state.

However, if a by-pass current IS is detected by the current sensor 600 disposed in the by-pass loop although the by-pass switch 6 is in the off state, and thus a by-pass voltage Ve exceeding either the reference voltage +VSE or -VSE is input to the comparison voltage input terminal of the comparators 812a and 812b, then a high-level signal is output to the OR gate 807 from the comparator which has received the by-pass voltage Ve exceeding the reference voltage VSE.

If the high-level signal is applied to the AND gate 820 from the OR gate 807, the AND gate 820 calculates the logical AND between the received high-level signal and the low-level signal applied to the negative-logic input terminal from the by-pass switch controlling circuit 821, and outputs a resultant high-level signal to the one-shot multivibrator 840 thereby triggering it.

If the one-shot multivibrator 840 operates and outputs a pulse signal to the base of the transistor 841, the transistor 841 turns on and thus an excitation current is supplied from the DC power source 843 into the shunt trip coil 842 connected to the collector thereby activating the shunt trip coil 842. As a result of the activation, the no-fuse breaker 8 is turned off and thus the by-pass current IS is shut off. The above-described operation offers a safeguard against a failure in which the by-pass switch 6 is not correctly in the off state.

The safeguard system described above satisfies the safety standards UL991 prescribing that an operator should be protected from an electric shock when he/she touches a terminal of the no-fuse breaker 8 even in the event that a part of the load current IL flows into the by-pass loop and thus into the no-fuse breaker 8 disposed near the standby power source 9 when the standby power source 9 is not operating (and thus no electric power is supplied from the standby power source 9).

In the conventional failure detection system for a power converter, it is required that a current sensor having a large current capacity be disposed in the by-pass loop so as to detect the by-pass current. In particular, in a power conversion system for supplying high power to a load, the size of the current sensor increases and thus the total size of the system also increases with the increase in the supplying power. This results in a great increase in the total cost of the system.

SUMMARY OF THE INVENTION

It is an object of the present invention to solve the above problems. More specifically, it is an object of the present invention to provide a failure detection system for a power converter, capable of detecting a failure of a by-pass switch without having to use a current sensor for detecting a by-pass current wherein such the current sensor will have a problem of the great size which will be more serious with the increase in the supplying power.

The present invention comprises a failure detection system for the by-pass switch of a power converter. The failure detection system detects a failure condition in the by-pass switch when power is being supplied from a primary power source, and a standby power source is turned off. A failure condition of the by-pass switch is determined by inverting the output current from the power converter and adding the inverted current to other output currents to determine whether a current is flowing in the standby power source when the standby power source is turned off. If the sum of the currents falls outside of a predetermined range of values, a failure judgement circuit produces a control signal indicating a failure of the by-pass switch. One advantage of adding current signals instead of sensing the actual current in the standby power source is that a reduced-sized current sensor may be used. A failure detection system according to embodiments of the present invention also reduces the likelihood of electric shock to an operator due to failure of the by-pass switch.

DESCRIPTION OF THE PREFERRED EMBODIMENTS

Embodiment 1

Figure 1:
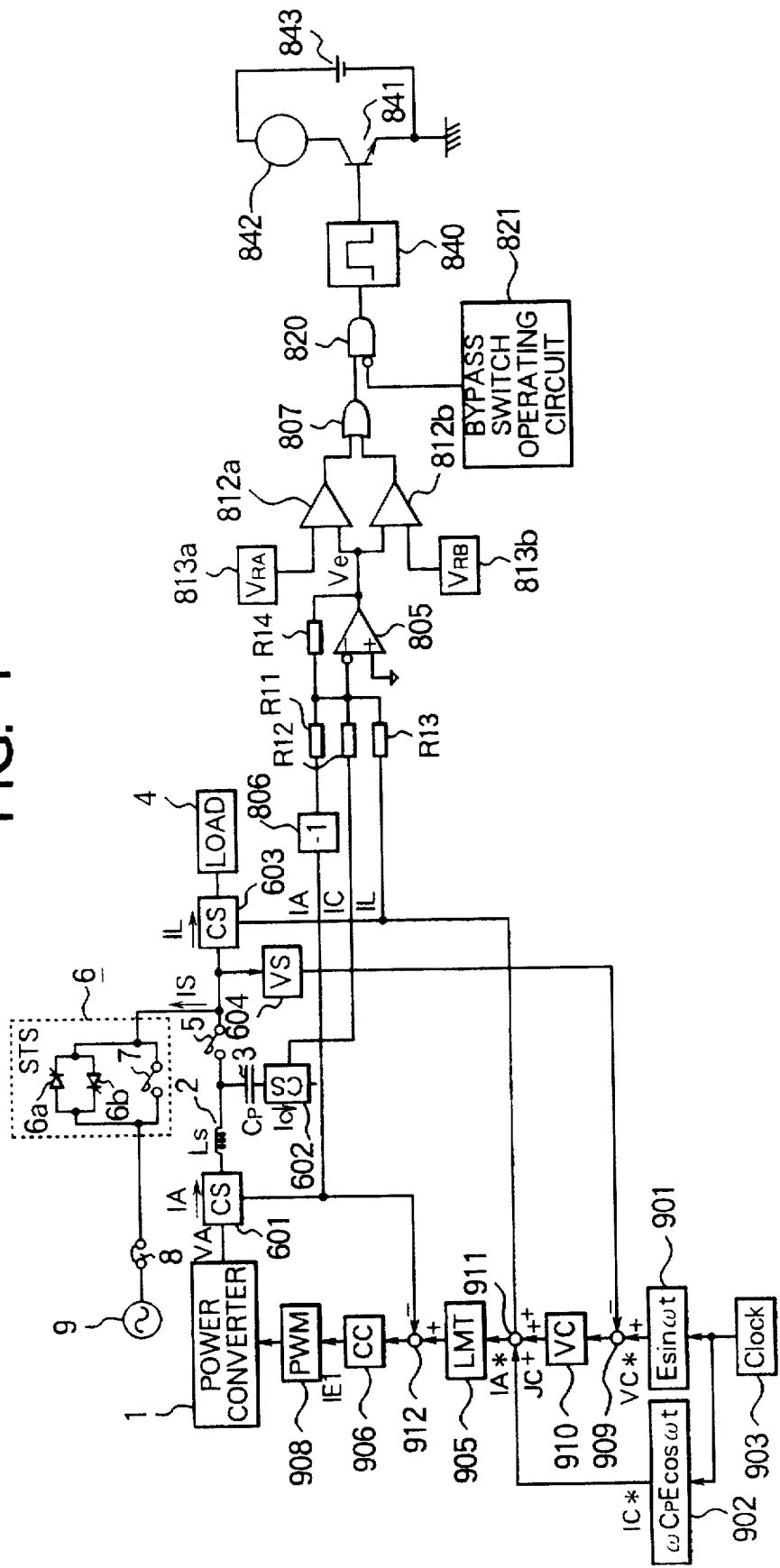
FIG. 1 is a block diagram of a first embodiment of a failure detection system for a power converter, according to the present invention.
Figure 13:
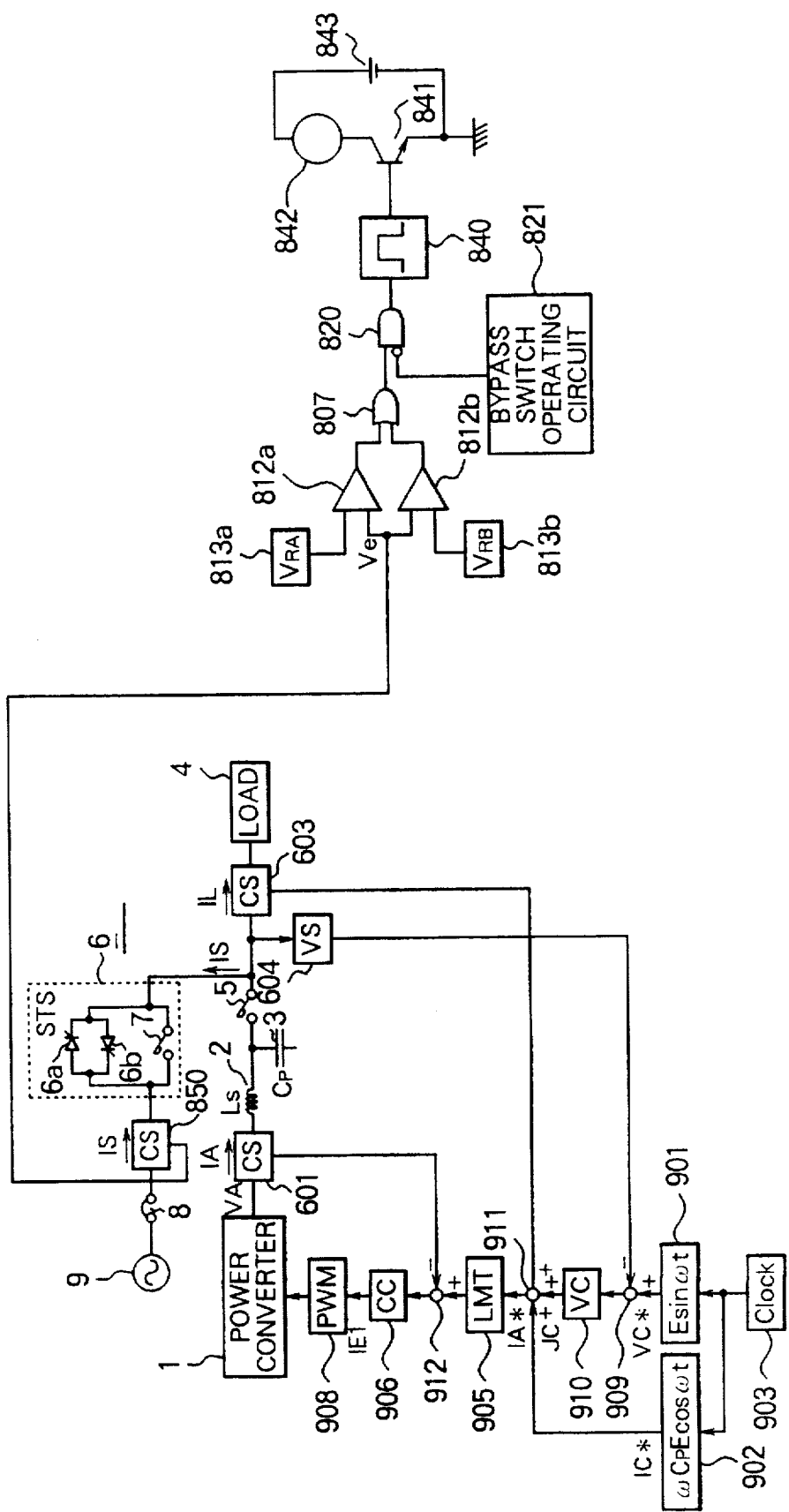
FIG. 13 is a block diagram of a conventional failure detection system for a power converter.
Figure 14:
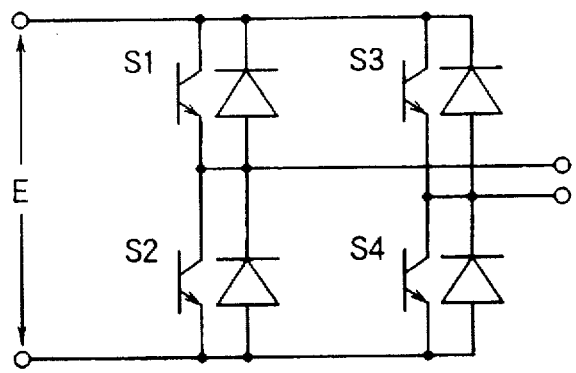
FIG. 14 is a circuit diagram of a common power converter.
Figure 15:
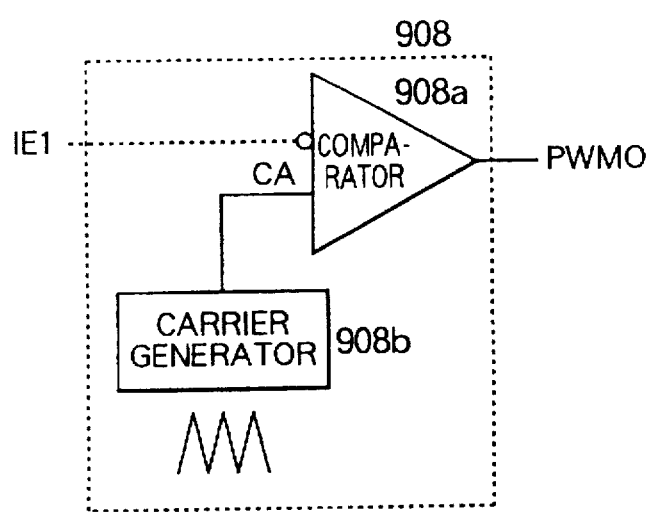
FIG. 15 is a circuit diagram of a PWM modulator for generating a PWM modulation signal which is applied to a power converter.

A first embodiment of a failure detection system for a power converter will be described below with reference to the accompanying drawings. FIG. 1 is a block diagram of the first embodiment of the failure detection system for a power converter. In this figure, similar reference numerals to those in FIG. 13 denote similar or corresponding elements. As shown in this figure, there is provided an operational amplifier 805 whose output terminal is connected to the comparison voltage input terminal of each comparator 812a and 812b. The output terminal of the operational amplifier 805 is coupled to its inverting input terminal via a feedback resistor R14. The inverting input terminal of the operational amplifier 805 is connected in common to one end of each input resistor R11 to R13. Furthermore, the noninverting input terminal of the operational amplifier 805 is grounded. An inverting adder serving as adding means is formed with these circuit elements.

The other end of the input resistor R11 is connected via an inverting amplifier 806 to a current sensor (first detecting means) 601 for detecting the inverter current IA. The other end of the input resistor R12 is connected to a current sensor (fifth detecting means) 602 for detecting the capacitor current Ic. The other end of the input resistor R13 is connected to a current sensor (second detecting means) 603 for detecting the load current IL. The other part is the same as that of the conventional system. The current detecting means 601 also forms fourth detecting means for detecting the current flowing through a reactor 2.

When no by-pass current IS flows through the by-pass switch 6, the currents have a relationship IA=IC+IL. Therefore, in this case, the sum Io of the currents flowing through each input resistor R11–R13 into the feedback resistor R14 via the inverting input terminal of the operational amplifier 805 is equal to −IA+IC+IL=0. Since the output voltage Ve (by-pass voltage Ve) of the operational amplifier 805 can be represented as Ve=−R14(−IA+IC+IL), the output voltage Ve becomes zero, and this voltage equal to zero is applied to the comparison voltage input terminal of each comparator 812a and 812b of the failure judgement means. Thus, the no-fuse breaker 8 disposed in the by-pass loop is maintained in a closed state as in the conventional system.

However, if a by-pass current IS flows through the by-pass switch 6 although the by-pass switch 6 is in the off state, the current relationship becomes IA=Ic+IL+IS. In this situation, the sum Io of the currents flowing through each input resistor R11–R13 into the feedback resistor R14 via the inverting input terminal of the operational amplifier 805 is still equal to −IA+IC+IL. As a result, the sum Io is no longer equal to zero due to the presence of the by-pass current IS. As a result, the output voltage (by-pass voltage Ve) of the operational amplifier 805 deviates from zero, and this output voltage is applied to the comparison voltage input terminal of each comparator 812a and 812b.

If the by-pass voltage Ve applied to the comparator 812a and 812b exceeds the reference voltage +VSE or −VSE, the comparator which has received the by-pass voltage Ve exceeding the reference voltage VSE outputs a high-level signal, which is in turn applied to an OR gate 807.

Thus, a high-level signal is output by the OR gate 807 and applied to an AND gate 820. The AND gate 820 calculates the logical AND between the received high-level signal and the low-level signal applied to the negative-logic input terminal from the by-pass switch controlling circuit 821 and outputs a resultant high-level signal to the one-shot multivibrator 840 thereby triggering it.

If the one-shot multivibrator 840 operates and outputs a pulse signal to the base of a transistor 841, the transistor 841 turns on and thus an excitation current is supplied from a DC power source 843 into a shunt trip coil 842 connected to the collector thereby activating the shunt trip coil 842. As a result of the activation, the no-fuse breaker 8 is turned off and thus the by-pass current IS is shut off. Thus, there is provided effective safeguard means against a failure in which the by-pass switch 6 is not correctly in the off state.

In general, the by-pass current IS is nearly equal to the current capacity of the inverter 1 (about 100%). In contrast, the capacitor current Ic is usually about 20% of the inverter current. Therefore, the current capacity required for the capacitor 3 is about 20% of the current capacity of the inverter 1. As a result, the current sensor 602 for detecting the current flowing through the capacitor 3 needs a smaller current capacity than the current sensor 600 which directly detects the by-pass current IS. This allows a reduction in the cost of the system and also a reduction in the size of the system.

Embodiment 2

Figure 2:
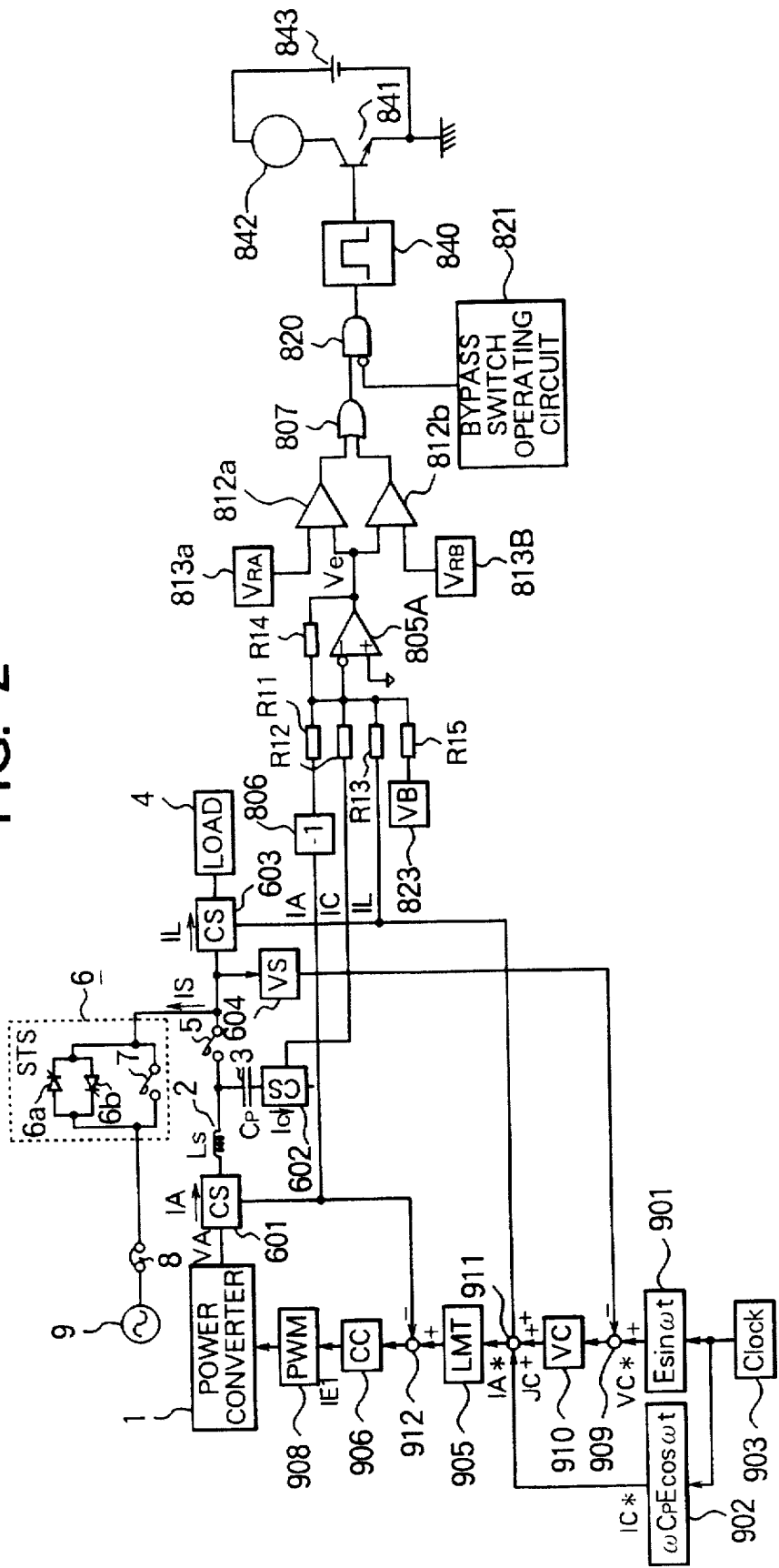
FIG. 2 is a block diagram of a second embodiment of a failure detection system for a power converter, according to the present invention.

In Embodiment 1 described above, the failure of the by-pass switch 6 is detected by judging whether the by-pass voltage Ve output by the operational amplifier 805 is zero or not, and a safeguarding operation is performed if a failure is detected. However, the output (Ve) of the operational amplifier 805 can be zero due to a failure of operational amplifier 805 itself. To avoid this problem, in this second embodiment, the failure of the by-pass switch 6 is detected by judging whether the by-pass voltage Ve exceeds a predetermined value, and a safeguarding operation is performed if a failure is detected. FIG. 2 is a block diagram of the second embodiment of the failure detection system for a power converter.

In this figure, similar reference numerals to those in FIG. 1 denote similar or corresponding elements. In the case of the operational amplifier 805A of the present embodiment, the inverting input terminal is connected, in addition to the input resistors R11 to R13, to a bias voltage generator 823 for generating a bias voltage VB via a resistor 15.

Furthermore, the reference voltage generator 813A generates a reference voltage VRA equal to the sum of a bias voltage VB and the positive reference voltage +VSE, while the reference voltage generator 813B generates a reference voltage VRB equal to the sum of the bias voltage VB and the negative reference voltage −VSE. When the reference voltages VRA and VRB contain the bias voltage VB, the output voltage (by-pass voltage) Ve of the operational amplifier 805A can be represented by the following equation:

$$Ve = IA \cdot R11 + Ic \cdot R12 + IL \cdot R13 + VB$$

As a result, when no by-pass current IS flows through the by-pass switch 6, the relationship among the currents detected by the current sensors 601, 602, and 603 can be represented as −IA+Ic+IL=0. Therefore, the output voltage Ve of the operational amplifier 805A constituting the inverting adder becomes equal to VB (Ve=VB). However, if the by-pass current IS is not zero, the sum of the currents output by the current sensors 601, 602, and 603 is no longer equal to zero (−IA+Ic+IL≠0), as described in Embodiment 1. Thus, the output voltage of the operational amplifier 805A constituting the inverting adder becomes the sum of the bias voltage VB and the voltage corresponding to the by-pass current IS (that is, Ve≠VB).

However, in practice, the current detected by each current sensor 601, 602 and 603 contains an error.

Therefore, each reference voltage generator 813A and 813B generates a reference voltage VRA or VRB equal to the sum of +VB and a positive or negative voltage ≦VSE (VSE>0) corresponding to the above detection error (thus VRA=+VSE +VB, VRB=+VSE+VB) and the generated reference voltages are applied to the reference voltage input terminal of the respective comparators 812a and 812b.

If a by-pass current IS does not flow through the by-pass switch 6, the output voltage Ve of the operational amplifier 805A applied to each comparator 812a and 812b becomes equal to VB, and thus the output voltage Ve falls between the reference voltages VRA and VRB. As a result, the output of each comparator 812a and 812b becomes low and is applied to the OR gate 807.

However, if the by-pass switch 6 turn s on and a by-pass current IS flows through the by-pass switch 6, the output Ve of the operational amplifier 805A becomes equal to the sum of VB and the voltage corresponding to the by-pass current IS, and thus exceeds either reference voltage VRA or VRB. As a result, either comparator outputs a high-level signal and this output signal is applied to the OR gate 807. Thus, as in Embodiment 1, the shunt trip coil 842 is activated and the no-fuse breaker 8 is turned off. In the case where the output of the operational amplifier 805A is equal to zero, the output of the operational amplifier 805A is less than the negative reference voltage VRB, and thus the comparator 812b outputs a high-level signal. This means that a failure of the operational amplifier 805A itself can be detected.

Embodiment 3

In Embodiments 1 and 2 described above, whether the by-pass switch 6 has a failure or not is determined on the basis of the output Ve of the inverting adder 805 or 805B via the comparatos 812a and 812b. Instead, in this third embodiment, the failure of the by-pass switch 6 is detected by judging the voltage Ve at the node at which the resistors R21 to R23 are connected to each other without using an inverting adder.

Figure 3:
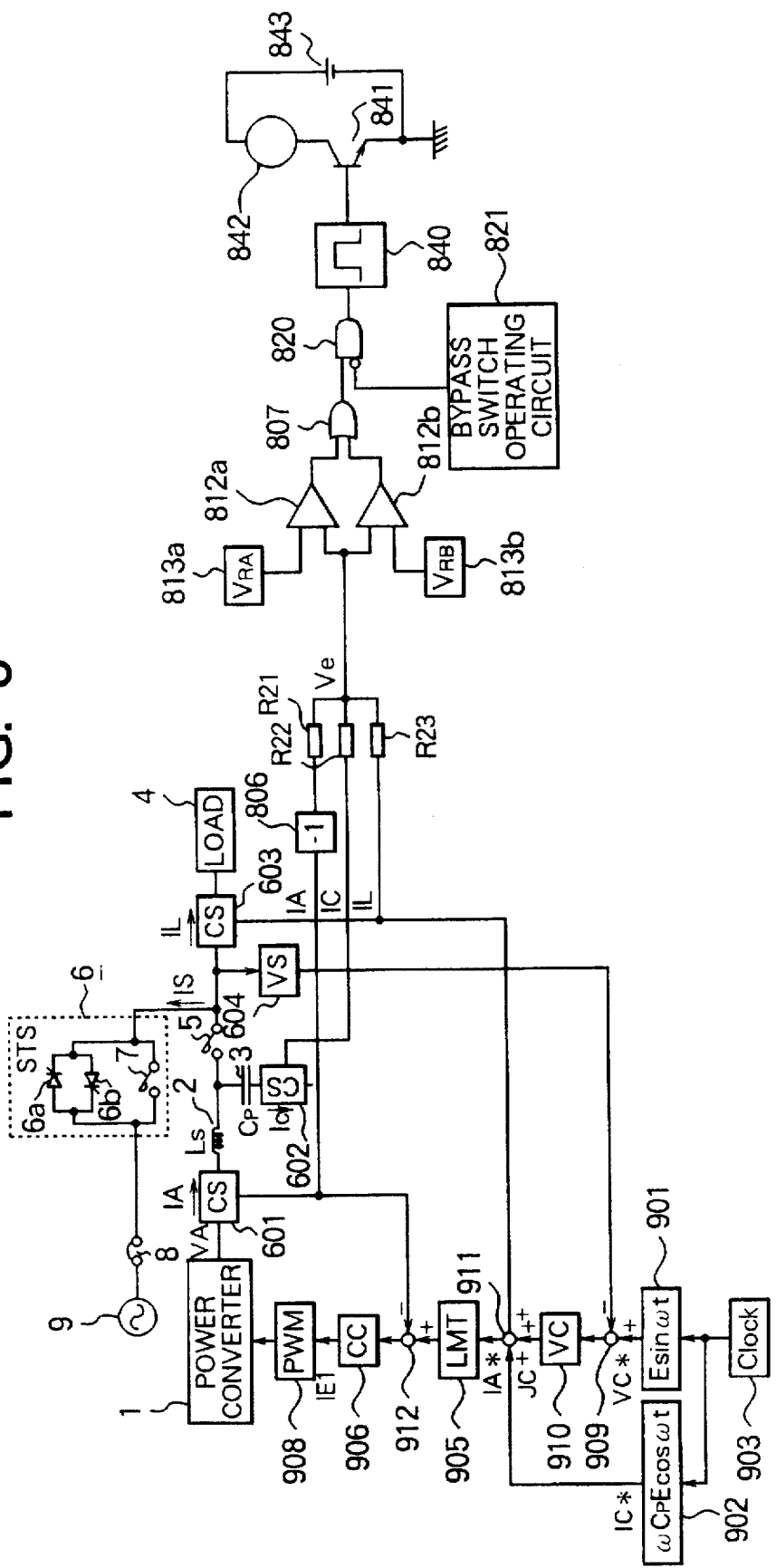
FIG. 3 is a block diagram of a third embodiment of a failure detection system for a power converter, according to the present invention.

FIG. 3 is a block diagram of the third embodiment of the failure detection system for a power converter. In this figure, similar reference numerals to those in FIG. 1 denote similar or corresponding elements. This embodiment differs from that shown in FIG. 1 in that the operational amplifier 805 and the feedback resistor R14 are removed, and the node at which the resistors R21 to R23 are connected to each other is directly connected to the comparison voltage input terminal of each comparator 812a and 812b.

If it is assumed that all the resistors R21, R22, and R23 have the same resistance, the voltage Ve at the connection node of the resistors R21, R22, and R23 can be represented as follows:

$$Ve(-IA+Ic+IL)/3$$

If no by-pass current IS flows through the by-pass switch 6 (the by-pass switch 6 is in an off state), the currents output by the current sensors 601, 602, and 603 satisfy the following condition.

$-IA+Ic+IL=0$

As a result, in this case, the voltage Ve at the connection node is equal to zero. On the other hand, when the by-pass switch 6 is in an on state and a by-pass current IS flows through the by-pass switch 6, the sum of the currents output from the current sensors 601, 602, and 603 is no longer equal to zero ($-IA+Ic+IL\neq 0$).

As a result, the voltage Ve at the connection node of the resistors R21, R22, and R23 deviates from zero (Ve≠0), and this voltage Ve is applied to the comparison voltage input terminal of each comparator 812a and 812b. However, in practice, the current detected by each current sensor 601, 602 and 603 contains an error. Therefore, each reference voltage generator 813a and 813b generates a positive or negative voltage ≦VSE (VSE>0) corresponding to the detection error (VRA=+VSE, VRB=-VSE) and the generated reference voltages are applied to the reference voltage input terminal of the respective comparators 812a and 812b. The voltage Ve is compared with these reference voltages at the comparators 812a and 812b. If the voltage Ve is not within the range between VRA and VRB, the voltage Ve exceeds either reference voltage, and thus the voltage Ve is judged to be not equal to zero.

That is, if the by-pass switch 6 goes to a conducting state and a by-pass current IS flows through the by-pass switch 6, the voltage at the connection node is no longer equal to zero, and exceeds either the reference voltage VRA or VRB. As a result, either comparator outputs a high-level signal and this output signal is applied to the OR gate 807. Thus, as in Embodiment 1, the shunt trip coil 842 is activated and the no-fuse breaker 8 is turned off.

Embodiment 4

In Embodiment 3 described above, the connection node of the resistors R21, R22, and R23 is coupled to the comparison voltage input terminal of each comparator 812a and 812b via a lead wire so that the voltage Ve at the connection node is compared with the reference voltages VRA and VRB wherein the by-pass switch 6 is considered to have no failure as long as the voltage Ve is between VRA and VRB.

Figure 4:
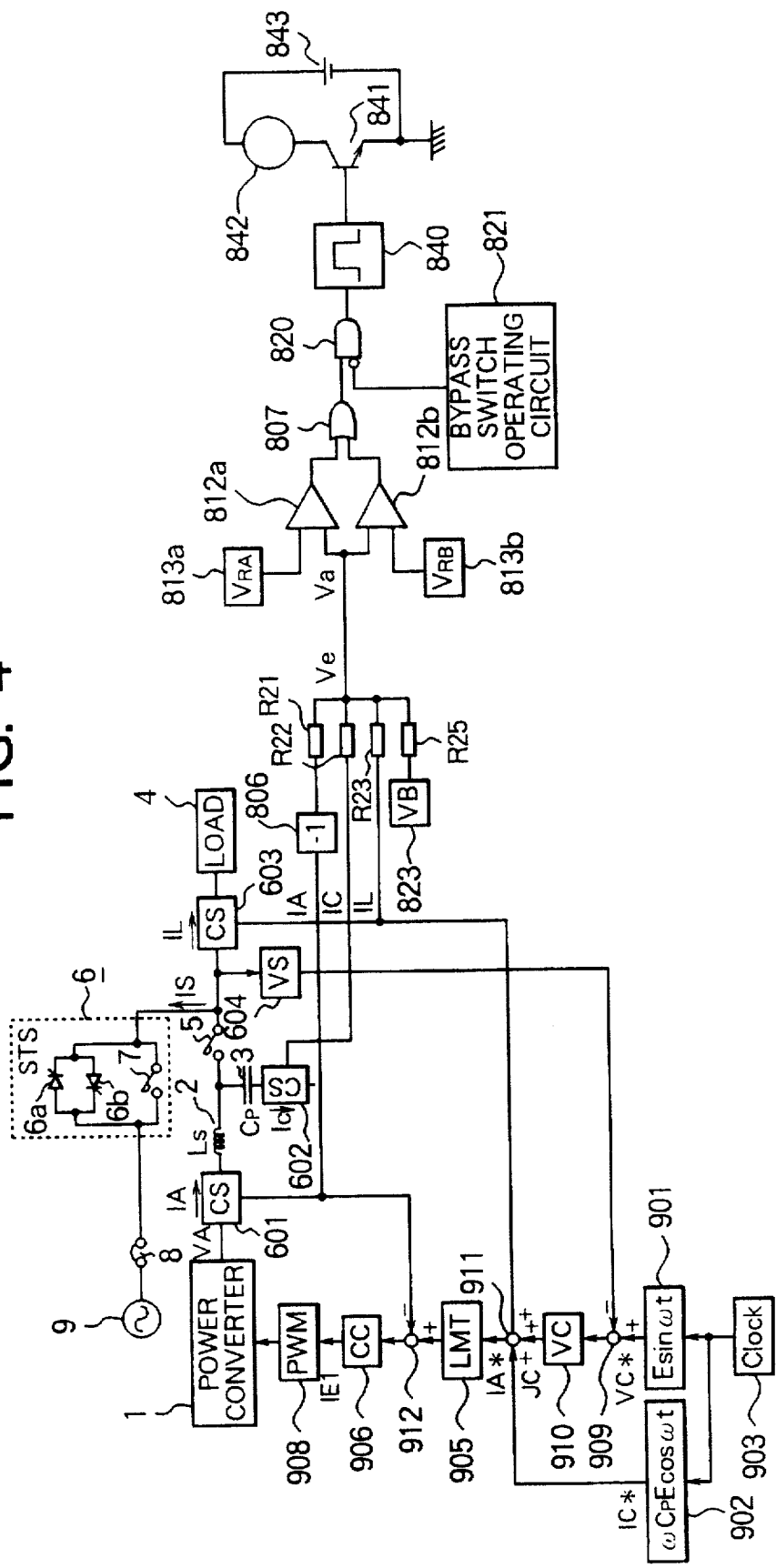
FIG. 4 is a block diagram of a fourth embodiment of a failure detection system for a power converter, according to the present invention.

In this fourth embodiment, the failure detection system is adapted to also detect a disconnection failure of the lead wire via which the connection node is connected to the comparators 812a and 812b. If such a failure is detected, the no-fuse breaker 8 is turned off. FIG. 4 illustrates the fourth embodiment of the failure detection system for a power converter. In this figure, similar reference numerals to those in FIG. 3 denote similar or corresponding elements. This fourth embodiment differs from the third embodiment described above in connection with FIG. 3 in that a bias voltage generator 823 for generating a bias voltage VB is connected via a resistor R25 to the connection node of the resistors R21 to R23.

If it is assumed here that all the resistors R21, R22, R23, and R25 have the same resistance, the connection node voltage Ve can be represented by the following equation:

$Ve(-IA+Ic+IL+VB)/4$

If no by-pass current IS flows through the by-pass switch 6 (the by-pass switch 6 is in an off state), the currents output by the current sensors 601, 602, and 603 satisfy the following condition:

$-IA+Ic+IL=0$

Therefore, in the case in which no by-pass current IS flows through the by-pass switch, the voltage Ve at the connection node is equal to VB/4. However, if the by-pass switch 6 goes to a conducting state and a by-pass current IS flows through the by-pass switch 6, the sum of the currents output from the current sensors 601, 602, and 603 is no longer equal to zero ($-IA+Ic+IL\neq 0$).

In this case, the voltage Ve at the connection node of the resistors R21, R22, and R23 deviates from VB/4 (Ve≠VB/4), and this voltage Ve is applied to the comparison voltage input terminal of each comparator 812a and 812b. However, in practice, the current detected by each current sensor 601, 602 and 603 contains an error. Therefore, each reference voltage generator 813a and 813b generates a reference voltage VRA or VRB equal to the sum of VB/4 and a positive or negative voltage ≦VSE (VSE>0) corresponding to the above detection error (thus VRA=+VSE+VB/4, VRB=-VSE+VB/4), and the voltage Ve is compared with these reference voltages at the comparators 812a and 812b. If the voltage Ve is not within the range between VRA and VRB, the voltage Ve exceeds either reference voltage, and thus it is judged that the voltage Ve is not equal to VB/4.

Thus, if the by-pass switch 6 goes to a conducting state and a by-pass current IS flows through the by-pass switch 6, the voltage Ve at the connection node is no longer equal to VB/4, and exceeds either the reference voltage VRA or VRB. As a result, either comparator outputs a high-level signal and this output signal is applied to the OR gate 807. Thus, as in Embodiment 1, the shunt trip coil 842 is activated and the no-fuse breaker 8 is turned off.

In the case where a disconnection failure occurs in the lead wire via which the connecting node is connected to the comparison voltage input terminal of the comparators 812a and 812b, the input voltage Va of each comparator 812a and 812b becomes zero and thus becomes lower than the reference voltage VRB. As a result, the comparator 812b, to which VRB =-SE+VB/4 is applied as the reference voltage, outputs a high-level signal, which is applied to the OR gate 807. Thus, as in Embodiment 1, the shunt trip coil 842 is activated and the no-fuse breaker 8 is turned off.

Embodiment 5

In Embodiment 3 described above, the failure of the by-pass switch 6 is detected by processing the inverter current IA, capacitor current Ic, and load current IL all in analog form output from the current sensors 601 to 603. Instead, in this fifth embodiment, after converting each current into digital form, the judgement of the failure is performed by a microprocessor.

Figure 5:
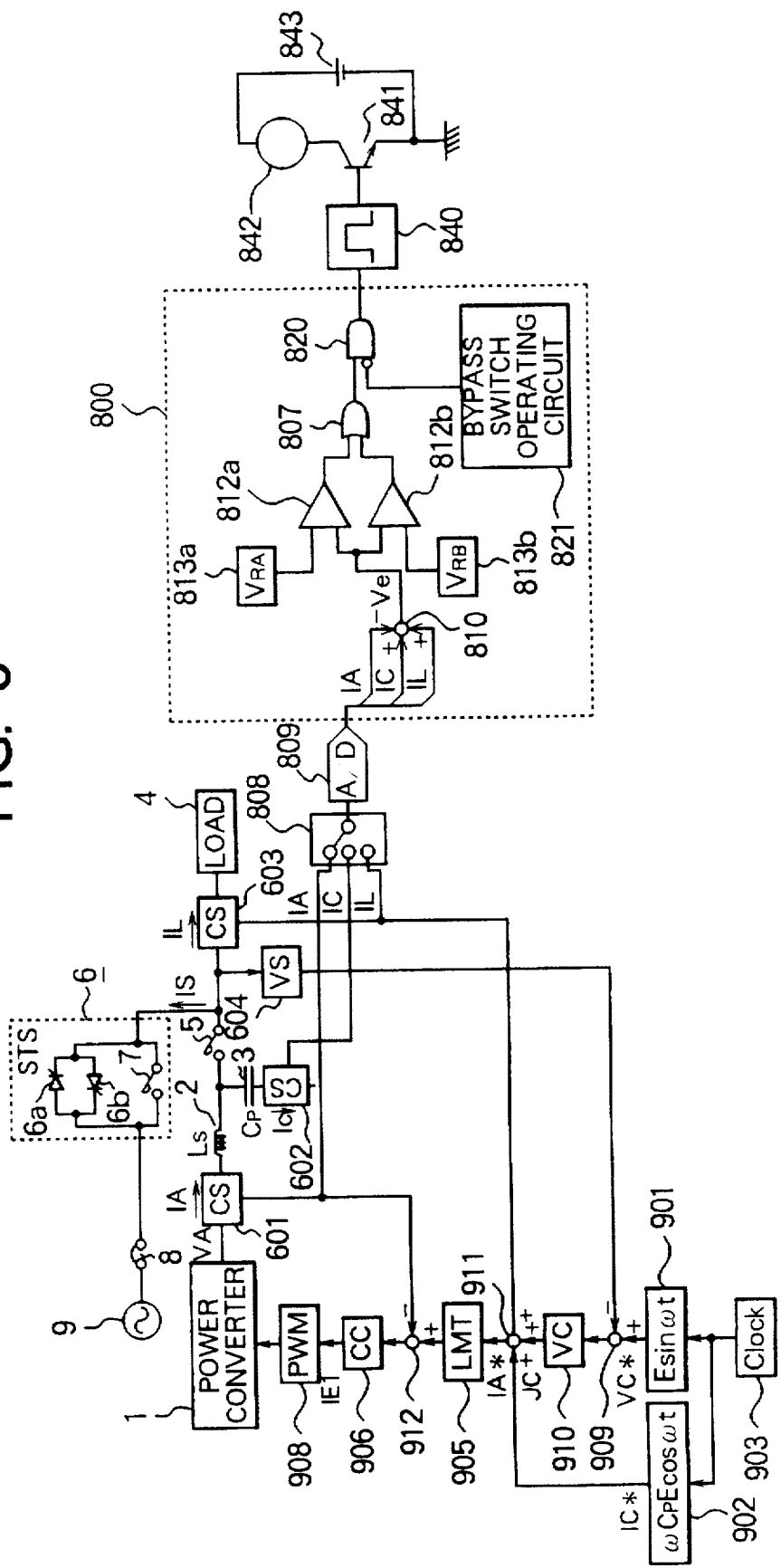
FIG. 5 is a block diagram of a fifth embodiment of a failure detection system for a power converter, according to the present invention.

FIG. 5 is a block diagram of the fifth embodiment of the failure detection system for a power converter. In this figure, similar reference numerals to those in FIG. 3 denote similar or corresponding elements. In this embodiment, there is provided a multiplexer 808 for selectively connecting the outputs of the current sensors 601 to 603 to an A/D converter 809 thereby successively providing an inverter current IA, capacitor current Ic, and load current IL to the A/D converter 809. The inverter current IA, capacitor current Ic, and load current IL are converted into digital signals and supplied to the microprocessor 800 which in turn judges whether the by-pass switch 6 has a failure on the basis of these digital signals.

The microprocessor 800 has various functions as described below. These include: an addition function for determining the sum of the inverter current IA, capacitor current Ic, and load current IL and converting the result Ve into an output voltage; a reference voltage generation function 813a for generating a positive reference voltage VRA with which the output voltage Ve is to be compared, wherein the positive reference voltage VRA is set taking into the account the detection accuracy of each current sensor 601 to 603; a reference voltage generation function 813b for generating a negative reference voltage VRB which is set taking into the account the detection accuracy of each current sensor 601 to 603; comparison functions 812a and 823b for comparing the output voltage Ve with the respective reference voltages VRA and VRB; a logical OR function 807 for determining the logical OR between the outputs given by the respective comparison functions 812a and 812b; and a logical AND function 820 for determining the logical AND between the output of the logical OR function 807 and the output of the by-pass switch operating function 821 and outputting the result in the form of a logical-level signal to an external one-shot multivibrator 840.

The operation of the present embodiment will be described below. The outputs of the current sensors 601 to 603 are selectively connected via a multiplexer 808 to an A/D converter 809 so that an inverter current IA, capacitor current Ic, and load current IL are successively supplied to the A/D converter 809. The A/D converter 809 converts each current input into a digital signal and sends the results to the microprocessor 800.

The addition function 810 of the microprocessor 800 calculates the sum of the input currents. The result is converted into a voltage form and output as an output voltage Ve. If no by-pass current IS flows through the by-pass switch 6, the output voltage Ve becomes zero and is applied to each comparison function 812a and 812b. As a result, as in Embodiment 3, the shunt trip coil 842 is not activated, and thus the no-fuse breaker 8 is not shut off.

Embodiment 6

In Embodiment 5 described above, the detected currents IA, Ic, and IL are applied to the A/D converter 809 wherein these currents are successively switched via the multiplexer 808. Instead, in this sixth embodiment, an A/D converter is provided for each current signal and all current signals are converted into a digital form at the same time.

Figure 6:
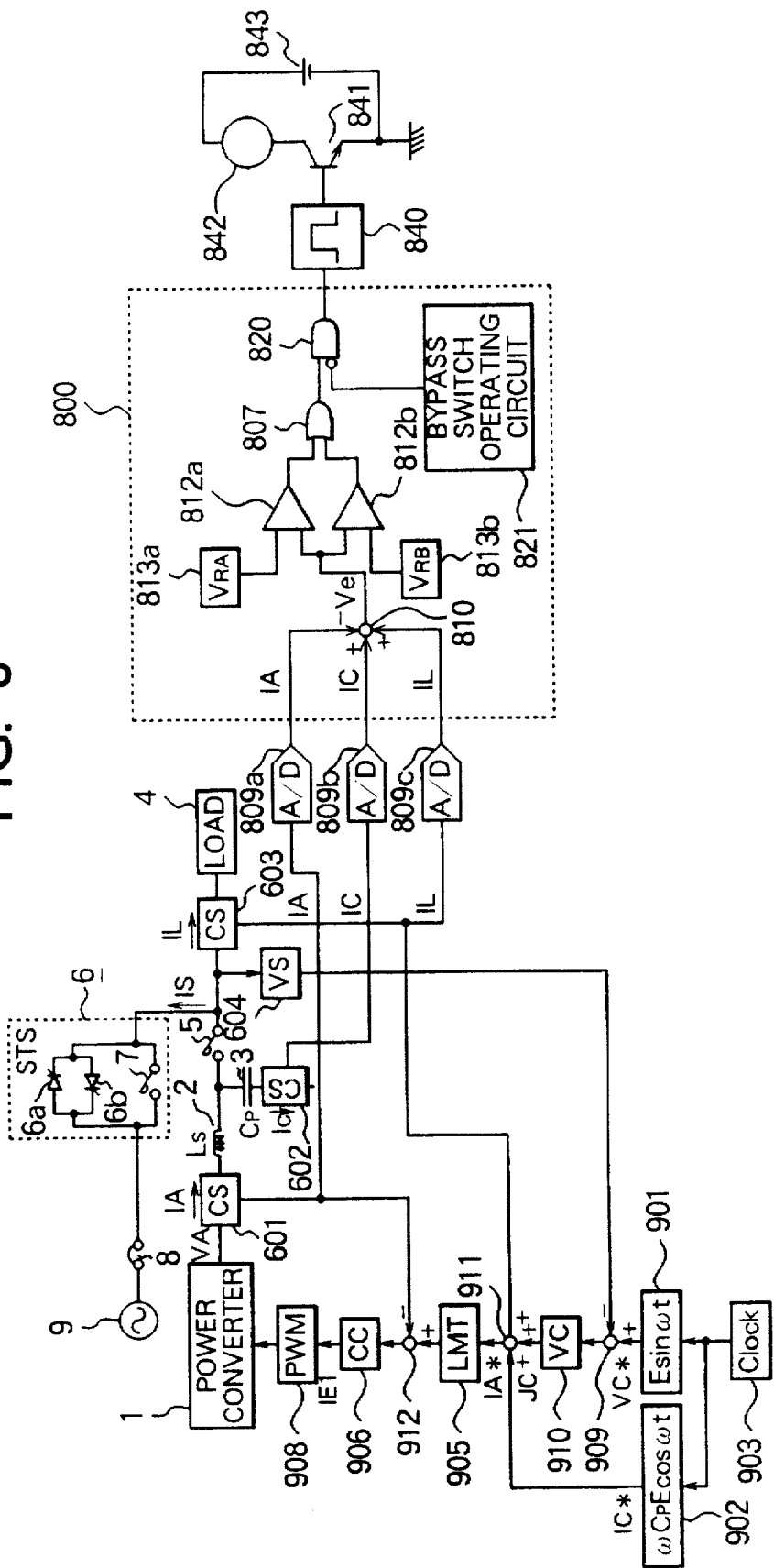
FIG. 6 is a block diagram of a sixth embodiment of a failure detection system for a power converter, according to the present invention.

FIG. 6 illustrates the sixth embodiment of the failure detection system for a power converter. In this figure, similar reference numerals to those in FIG. 5 denote similar or corresponding elements. The inverter current IA, capacitor current Ic, and load current IL detected by the current sensors 601, 602, and 603 are converted into digital signals by A/D converters 809a, 809b, and 809c, respectively.

As in Embodiment 5, the microprocessor 800 judges whether the by-pass switch 6 has a failure or not in such a manner that if Ve=0, the microprocessor 800 concludes that there is no failure, while the microprocessor 800 concludes that the by-pass switch 6 has a failure if a by-pass current IS flows through the by-pass switch 6 and thus Ve≠0. Furthermore, if any one of A/D converters 809a, 809b, and 809c has a failure although no by-pass current IS flows through the by-pass switch 6, the relationship among currents becomes $-IA+Ic+IL \neq 0$ and thus the output voltage becomes Ve≠0. This means that not only a failure of the by-pass switch 6 but also a failure of A/D converters can be detected.

Embodiment 7

In Embodiments 1 to 6 described above, the current sensor 602 is employed for detecting the capacitor current, which has a small current capacity compared to the current sensor 801 for detecting the by-pass current. In contrast, in this seventh embodiment, the current is detected from the inverter output voltage VS detected by the existing voltage sensor 604.

Figure 7:
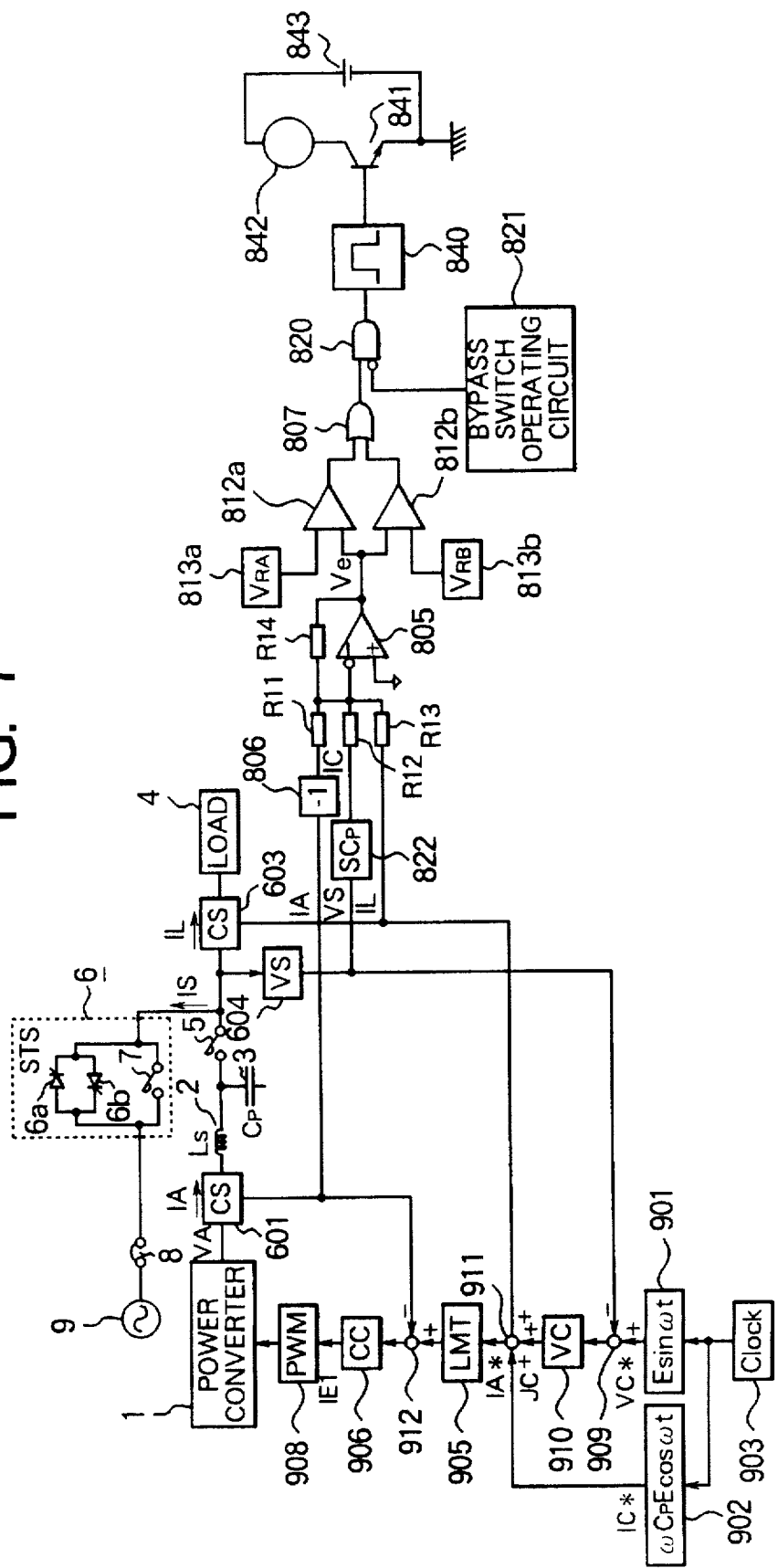
FIG. 7 is a block diagram of a seventh embodiment of a failure detection system for a power converter, according to the present invention.

FIG. 7 is a block diagram of the seventh embodiment of the failure detection system for a power converter. In this figure, similar reference numerals to those in FIG. 1 denote similar or corresponding elements. This embodiment differs from Embodiment 1 described above in connection with FIG. 1 in that instead of detecting the capacitor current Ic using the current sensor 602, the capacitor current Ic is calculated by performing differentiation (S·Cp·VS), using a differentiator 822, on the output voltage VS of the inverter 1 is detected by the voltage sensor 604. The voltage sensor 604 and the differentiator 822 form third detecting means or sixth detecting means.

In general, there is a phase difference of π/2 between the voltage and the current associated with a capacitor. Therefore, it is possible to obtain the capacitor current Ic by differentiating the inverter output voltage VS using the differentiator 822. The other part is the same as that of Embodiment 1. The operation of the present embodiment will be described below.

The relationship among the inverter current IA and the load current IL, detected by the current sensors 601 and 603 and the capacitor current Ic (=S·Cp·VS) obtained by differentiating the inverter output voltage VS detected by the voltage sensor 604 using the differentiator 822 is represented by the following equation:

$$-IA+Ic+IL=-IA+S \cdot Cp \cdot Vc+IL=0$$

Therefore, if no by-pass current IS flows through the by-pass switch 6 (the by-pass switch 6 is in an off state), the outputs of the detectors 601, 603, 604 satisfy the following equation:

$$-IA+S \cdot Cp \cdot Vc+IL=0$$

Thus, the output voltage Ve of the operational amplifier 805 forming the inverting adder is equal to zero, and this output voltage is applied to the comparators 812a and 812b. On the other hand, in the case where a failure occurs in the by-pass switch 6 and a by-pass current IS flows through the by-pass switch 6, the relation among the outputs of the detectors 601, 603, and 604 can be represented by the following equation:

$$-IA+S \cdot Cp \cdot Vc+IL \neq 0$$

As a result, the output voltage Ve of the operational amplifier 805 forming the inverting adder is no longer equal to zero (Ve≠0), and a certain voltage not equal to zero appears at the input of the comparators 812a and 812b. Also in this embodiment, the detection error of each detector is taken into account, and the reference voltage generators 813a and 813b generate a positive reference voltage VRA equal to +VSE relative to the 0 V line voltage and a negative reference voltage VRB equal to −VSE relative to the 0 V line voltage, respectively, wherein these reference voltages are applied to the reference voltage input terminal of the respective comparators 812a and 812b.

Therefore, when the output voltage Ve has a value between the reference voltages VRA and VRB, the outputs of both comparators 812a and 812b are at a low level. However, if the output voltage Ve exceeds either the reference voltage VRA or VRB, either comparator outputs a high-level signal to the OR gate 807.

As described above, if the output voltage Ve of the operational amplifier 805 is not equal to zero (Ve≠0) although the by-pass switch controlling circuit 821 outputs a low-level signal which indicates that the by-pass switch 6 should be in an off state, it is concluded that the by-pass switch 6 has a failure. If a failure is detected, the transistor 841 is turned on so that the shunt trip coil 842 is activated and the no-fuse breaker 8 is shut off, as in Embodiment 1.

13

In this embodiment, as described above, the current is calculated from the inverter output voltage VS detected by the existing voltage sensor 604. This makes it possible to detect the failure of the by-pass switch 6 using a simple circuit.

Embodiment 8

Figure 8:
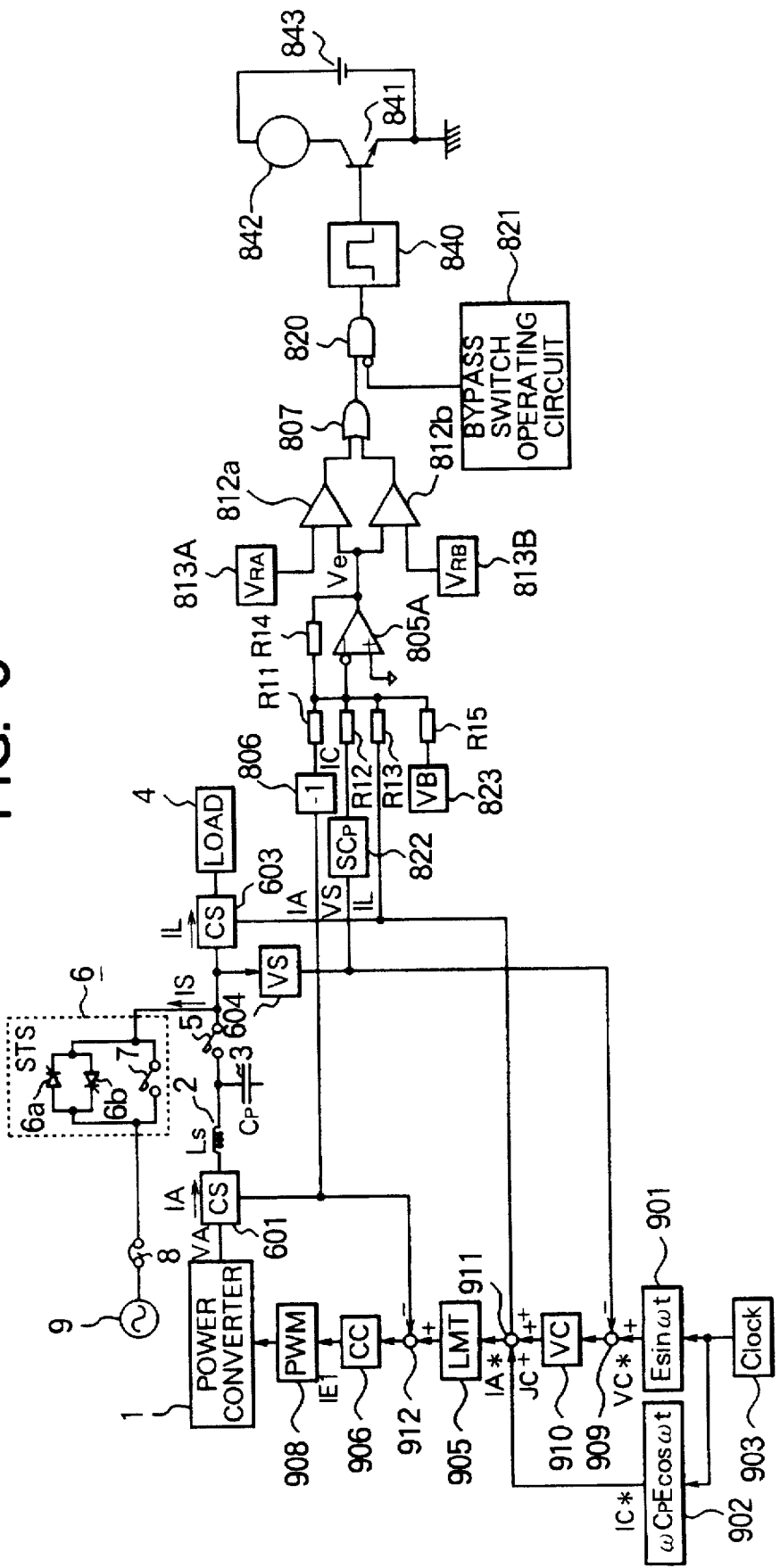
FIG. 8 is a block diagram of an eighth embodiment of a failure detection system for a power converter, according to the present invention.

In Embodiment 7 described above, the failure of the by-pass switch 6 is detected by judging whether the output voltage Ve of the operational amplifier 805 is equal to zero or not. However, the output voltage Ve of the operational amplifier 805 can become zero as a result of a failure of the operational amplifier 805 itself. Thus, this eighth embodiment is adapted to also detect such the failure. FIG. 8 is a block diagram of the eighth embodiment of the failure detection system for a power converter. In this figure, similar reference numerals to those in FIG. 7 denote similar or corresponding elements. The difference in the circuit structure from Embodiment 7 described above in connection with FIG. 7 is that a bias voltage generator 823 is connected to the inverting input terminal of the operational amplifier 805A via a resistor R15.

As a result of the addition of the bias voltage generator 823 and the resistor R15, the output voltage Ve of the operational amplifier 805 forming the inverting adder becomes:

$$Ve = -IA + S \cdot Cp \cdot Vc + IL + VB$$

Therefore, if no by-pass current IS flows through the by-pass switch 6 (the by-pass switch 6 is in an off state), the outputs of the detectors 601, 603, 604 satisfy the following equation:

$$-IA + S \cdot Cp \cdot Vc + IL = 0$$

Thus, the output voltage Ve of the operational amplifier 805A constituting the inverting adder is equal to VB (Ve= VB) and this output voltage Ve is applied to the comparators 812a and 812b. On the other hand, in the case where a failure occurs in the by-pass switch 6 and a by-pass current IS flows through the by-pass switch 6, the relation among the outputs of the detectors 601, 602, and 603 is represented by the following equation:

$$-IA + S \cdot Cp \cdot Vc + IL \neq 0$$

Thus, the output voltage Ve of the operational amplifier 805A constituting the inverting adder is no longer equal to VB (Ve≠VB) and this output voltage Ve is applied to the comparators 812a and 812b. Also in this embodiment, the detection error of each detector is taken into account, and the reference voltage generators 813A and 813B generate a positive reference voltage VRA equal to +VB +VSE and a negative reference voltage VRB equal to +VB−VSE, respectively, wherein these reference voltages are applied to the reference voltage input terminal of the respective comparators 812a and 812b.

Therefore, when the output voltage Ve has a value between the reference voltages VRA and VRB, the outputs of both comparators 812a and 812b are at a low level. However, if the output voltage Ve exceeds either the reference voltage VRA or VRB, either comparator outputs a high-level signal to the OR gate 807.

As described above, if the output voltage Ve of the operational amplifier 805 is not equal to zero (Ve≠0) although the by-pass switch controlling circuit 821 outputs a low-level signal which indicates that the by-pass switch 6 should be in an off state, it is judged that the by-pass switch

14

6 has a failure. If a failure is detected, the transistor 841 is turned on so that the shunt trip coil 842 is activated and the no-fuse breaker 8 is shut off, as in Embodiment 7.

In this embodiment, as described above, the current is calculated from the inverter output voltage VS detected by the existing voltage sensor 604. This makes it possible to detect the failure of the by-pass switch 6 using a simple circuit. Furthermore, in this embodiment, if Ve becomes zero as a result of a failure of the operational amplifier 805A itself, the failure is detected by the comparator 812b.

Embodiment 9

In Embodiment 8 described above, whether the by-pass switch 6 has a failure or not is determined by judging the output Ve of the inverting adder via the comparatos 812a and 812b. Instead, in this ninth embodiment, the failure of the by-pass switch 6 is detected by judging the voltage Ve at the node at which the resistors R21 to R23 are connected to each other without using an inverting adder.

Figure 9:
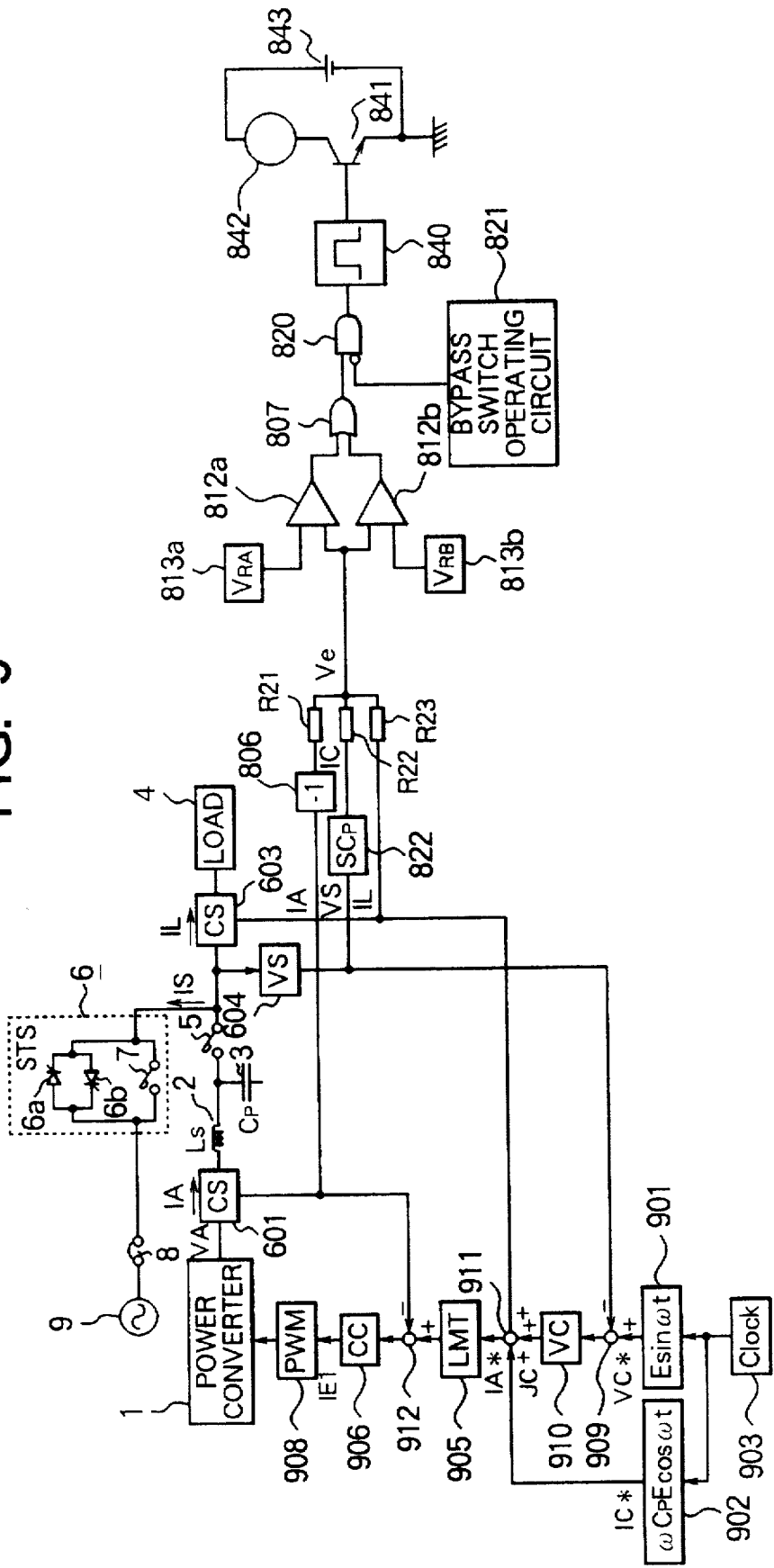
FIG. 9 is a block diagram of a ninth embodiment of a failure detection system for a power converter, according to the present invention.

FIG. 9 is a block diagram of the eighth embodiment of the failure detection system for a power converter. In this figure, similar reference numerals to those in FIG. 8 denote similar or corresponding elements. The difference from FIG. 8 is that the operational amplifier 805A and the feedback resistor R14 are removed and the connection node of the resistors R21 to R23 is directly connected to the comparison voltage input terminal of each comparator 812a and 812b.

If it is assumed that all the resistors R21, R22, and R23 have the same resistance, the voltage Ve at the connection node of the resistors R21, R22, and R23 can be represented as follows:

$$Ve(-IA + S \cdot Cp \cdot Vc + IL)/3$$

If no by-pass current IS flows through the by-pass switch 6 (the by-pass switch 6 is in an off state), the currents output by the current sensors 601, 603, and 604 satisfy the following condition:

$$-IA + S \cdot Cp \cdot Vc + IL = 0$$

As a result, in this case, the voltage Ve at the connection node is equal to zero. However, if the by-pass switch 6 is in an on-state and a by-pass current IS flows through the by-pass switch 6, the relationship among the outputs of the current sensors 601, 603 and the output of the voltage sensor 604 is represented by the following equation:

$$-IA + S \cdot Cp \cdot Vc + IL \neq 0$$

In this case, the voltage Ve at the connection node of the resistors R21, R22, and R23 deviates from zero (Ve≠0), and this voltage Ve is applied to the comparison voltage input terminal of each comparator 812a and 812b. However, in practice, the current detected by each current sensor 601 and 603 and the voltage detected by the voltage sensor 604 contain errors. Therefore, each reference voltage generator 813a and 813b generates a reference voltage VRA or VRB equal to a positive or negative voltage ≦VSE (VSE>0) corresponding to the above detection error (thus VRA=+ VSE, VRB=−VSE), and the voltage Ve is compared with these reference voltages at the comparators 812a and 812b. If the voltage Ve is not within the range between VRA and VRB, the voltage Ve exceeds either reference voltage, and thus it is concluded that the voltage Ve is not equal to zero.

If the by-pass switch 6 goes to a conducting state and a by-pass current IS flows through the by-pass switch 6, the voltage at the connection node is no longer equal to zero, and exceeds either the reference voltage VRA or VRB. As a result, either comparator outputs a high-level signal and this output signal is applied to the OR gate 807. Thus, as in Embodiment 7, the shunt trip coil 842 is activated-and the no-fuse breaker 8 is shut off.

Embodiment 10

In Embodiment 9 described above, the connection node of the resistors R21, R22, and R23 is coupled to the comparison voltage input terminal of each comparator 812a and 812b via a lead wire so that the voltage Ve at the connection node is compared with the reference voltages VRA and VRB, wherein the by-pass switch 6 is considered to have no failure as long as the voltage Ve is between VRA and VRB.

Figure 10:
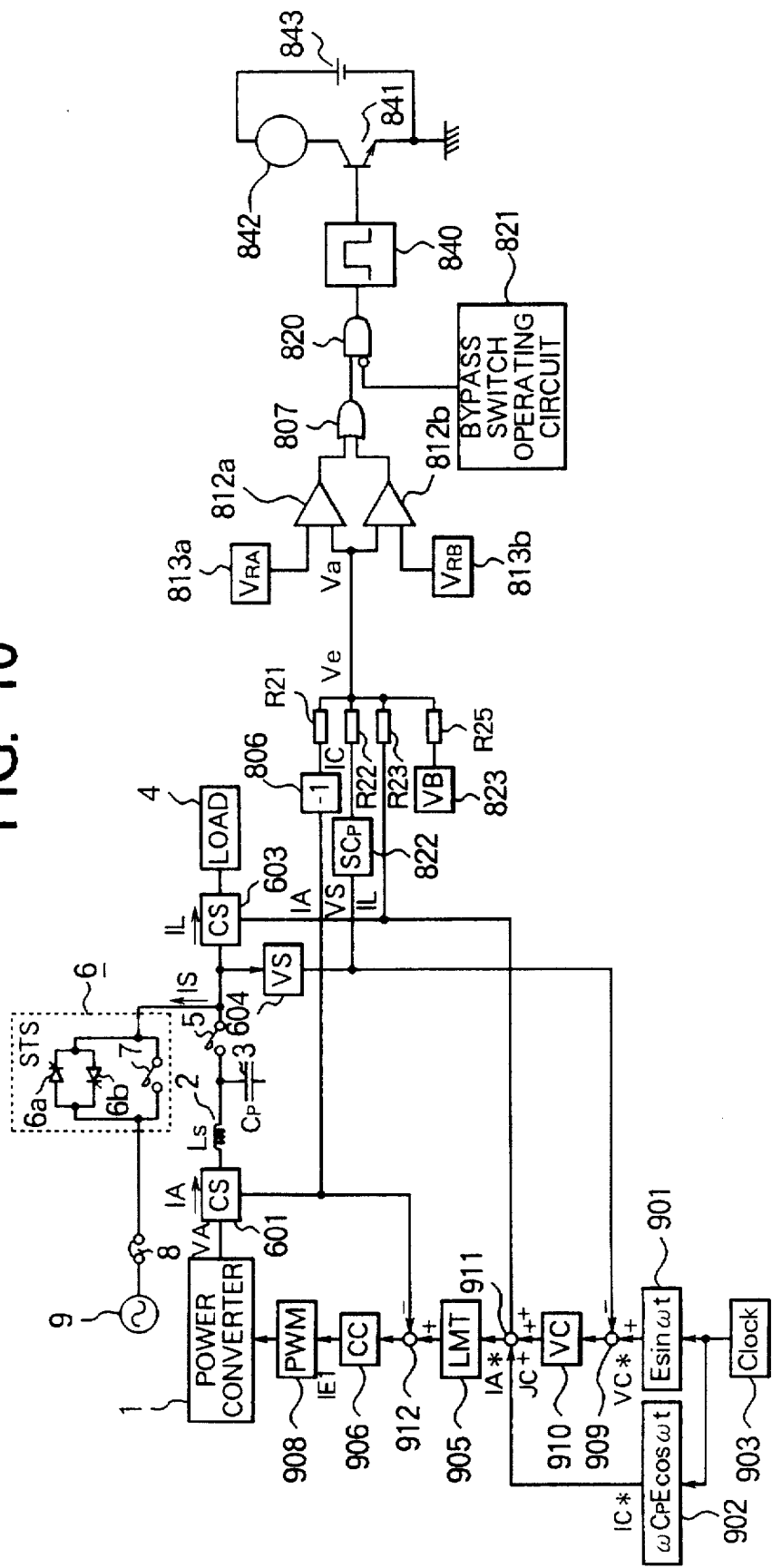
FIG. 10 is a block diagram of a tenth embodiment of a failure detection system for a power converter, according to the present invention.

In this tenth embodiment, the failure detection system is adapted to also detect a disconnection failure of the lead wire via which the connection node is connected to the comparators 812a and 812b and the no-fuse breaker 8 is turned off if such a failure is detected. FIG. 10 illustrates the tenth embodiment of the failure detection system for a power converter. In this figure, similar reference numerals to those in FIG. 9 denote similar or corresponding elements. This tenth embodiment differs from the ninth embodiment described above in connection with FIG. 9 in that a bias voltage generator 823 for generating a bias voltage VB is connected via a resistor R25 to the connection node of the resistors R21 to R23.

The operation of the present embodiment will be described below. If it is assumed here that all the resistors R21, R22, R23, and R25 have the same resistance, the connection node voltage Ve can be represented by the following equation:

$$Ve(-IA+S \cdot Cp \cdot VC+IL+VB)/4$$

If no by-pass current IS flows through the by-pass switch 6 (the by-pass switch 6 is in an off state), the currents output by the current sensors 601, 603, and 604 satisfy the following condition:

$$-IA+S \cdot Cp \cdot VC+IL=0$$

Therefore, in the case in which no by-pass current IS flows, the voltage Ve at the connection node is equal to VB/4. However, if the by-pass switch 6 is in an on-state and a by-pass current IS flows through the by-pass switch 6, the relationship among the outputs of the current sensors 601, 603 and the output of the voltage sensor 604 is represented by the following equation:

$$-IA+S \cdot Cp \cdot VC+IL \neq 0$$

In this case, the voltage Ve at the connection node of the resistors R21, R22, R23, and R25 deviates from VB/4 (Ve ≠VB/4), and this voltage Ve is applied to the comparison voltage input terminal of each comparator 812a and 812b. However, in practice, the current detected by each current sensor 601 and 602 and the voltage detected by the voltage sensor 604 contain an error. Therefore, each reference voltage generator 813a and 813b generates a reference voltage VRA or VRB equal to the sum of VB/4 and a positive or negative voltage ≦VSE (VSE>0) corresponding to the above detection error (thus VRA=+VSE+VB/4, VRB=−VSE+VB/4), and the voltage Ve is compared with these reference voltages at the comparators 812a and 812b. If the voltage Ve is not within the range between VRA and VRB, the voltage Ve exceeds either reference voltage, and thus the voltage Ve is judged as being not equal to VB/4.

If the by-pass switch 6 goes to a conducting state and a by-pass current IS flows through the by-pass switch 6, the voltage at the connection node is no longer equal to zero, and exceeds either the reference voltage VRA or VRB. As a result, either comparator outputs a high-level signal and this output signal is applied to the OR gate 807. Thus, as in Embodiment 9, the shunt trip coil 842 is activated and the no-fuse breaker 8 is shut off.

In the case where a disconnection failure occurs in the lead wire via which the connecting node is connected to the comparison voltage input terminal of the comparators 812a and 812b, the input voltage Va of each comparator 812a and 812b becomes zero. As a result, the comparator 812b having the reference voltage VRB equal to −SE+VB/4 outputs a high-level signal, which is applied to the OR gate 807. Thus, as in the case of the failure of the by-pass switch 6, the shunt trip coil 842 is activated and the no-fuse breaker 8 is shut off.

Embodiment 11

In Embodiment 10 described above, the failure of the by-pass switch 6 is detected by processing the analog signals such as the inverter current IA, capacitor current Ic, and load current IL output from the detectors 601 to 603. Instead, in this eleventh embodiment, the judgement of the failure is performed by a microprocessor on the basis of the digital signals obtained by converting the current signals into digital form.

Figure 11:
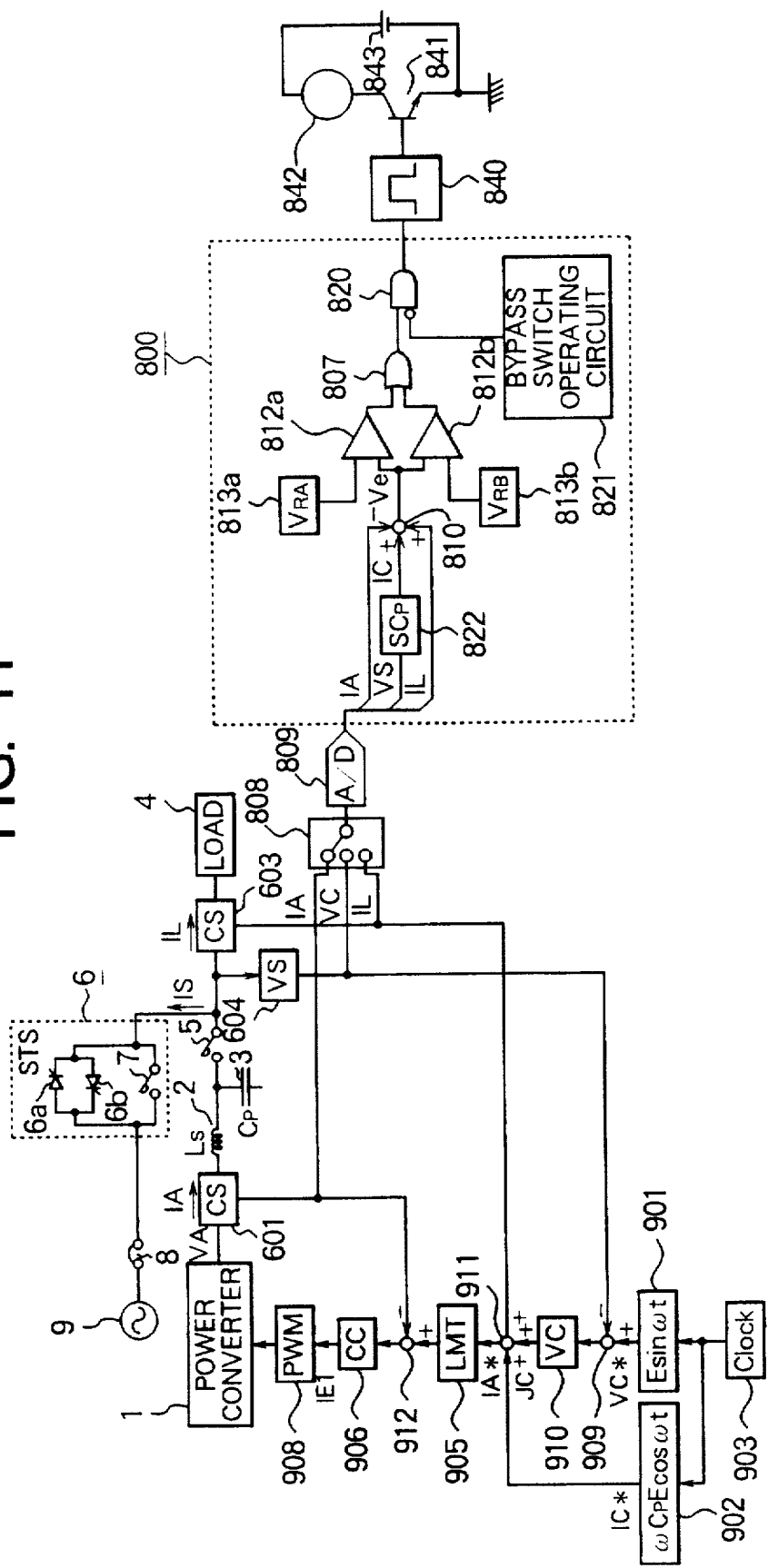
FIG. 11 is a block diagram of an eleventh embodiment of a failure detection system for a power converter, according to the present invention.

FIG. 11 is a block diagram of the eighth embodiment of the failure detection system for a power converter. In this figure, similar reference numerals to those in FIG. 10 denote similar or corresponding elements. The outputs of the detectors 601 to 603 are selectively connected via a multiplexer 808 to an A/D converter 809 so that an inverter current IA, inverter output voltage VS, and load current IL are successively supplied to the A/D converter 809. The A/D converter 809 converts these signals into a digital form and sends the results to the microprocessor 800. The microprocessor 800 judges whether the by-pass switch 6 has a failure or not on the basis of the received signals.

In addition to the functions described above in Embodiment 5, the microprocessor 800 also has a differentiating function 823 for differentiating the inverter output voltage VS thereby obtaining the capacitor current.

The operation of the present embodiment will be described below. The inverter current IA, load current IL, and inverter output voltage VS detected by the current sensors 601, 603 and the voltage sensor 604, respectively, are successively applied to the A/D converter 809 via the multiplexer. The A/D converter 809 converts each current input into a digital signal and sends the result to the microprocessor 800.

The addition function 810 of the microprocessor 800 determines the sum of the currents IA, IL and also the capacitor current Ic obtained by differentiating the inverter output voltage VS via the differentiating function, and converts the result into a digital form thereby generating an output voltage Ve. If no by-pass current IS flows through the by-pass switch 6, the output voltage Ve is equal to zero, and this output voltage Ve is applied to each comparison function 812a and 812b. In this case, as in Embodiment 3, the shunt trip coil 842 is not activated, and thus the no-fuse breaker 8 is not shut off.

Embodiment 12

In Embodiment 11 described above, the detected currents IA, IL, and the voltage VS are applied to the A/D converter 809 wherein these signals are successively switched via the multiplexer 808. Instead, in this twelfth embodiment, an A/D converter is provided for each current signal and all current signals are converted into a digital form at the same time.

Figure 12:
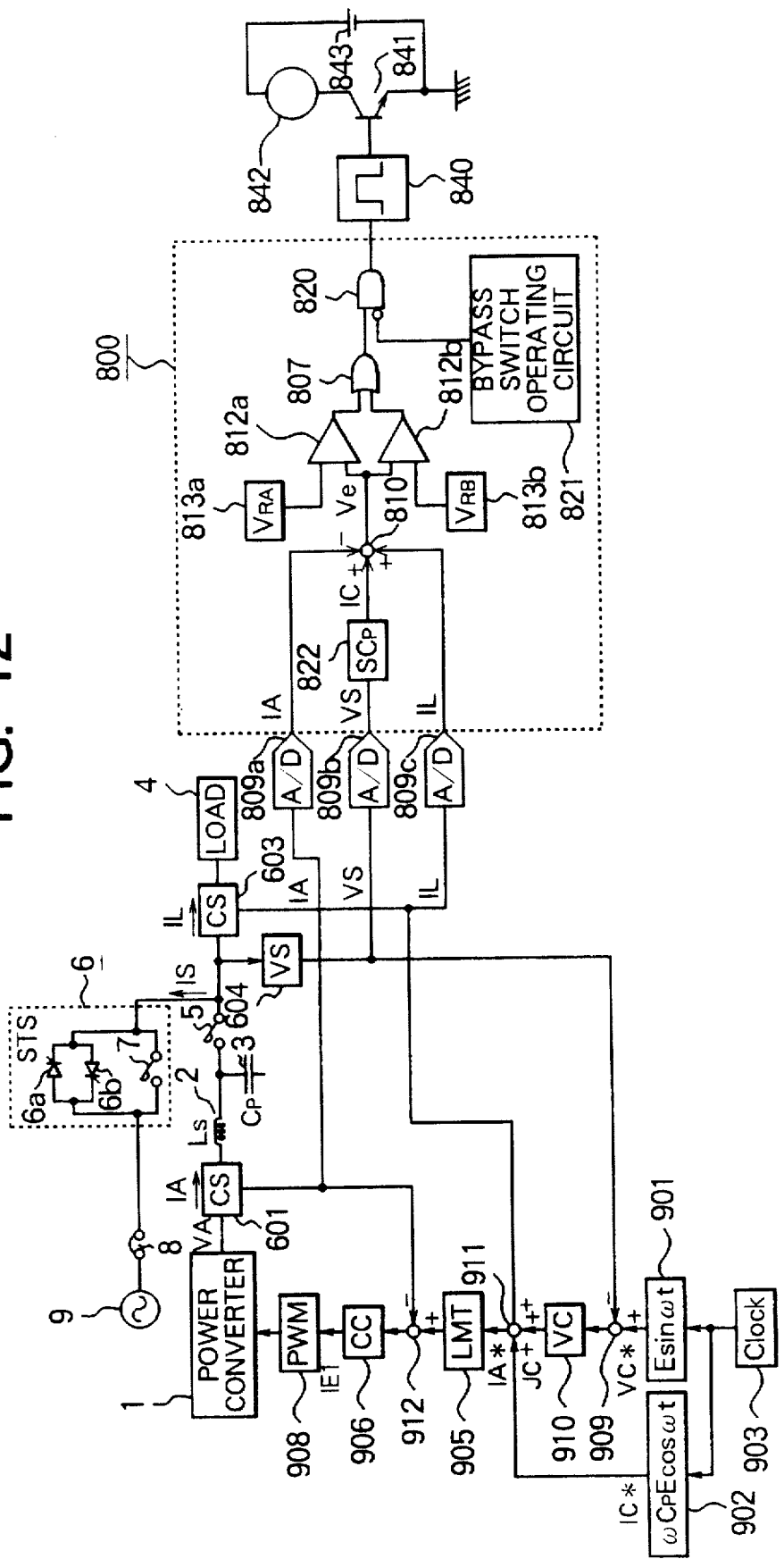
FIG. 12 is a block diagram of a twelfth embodiment of a failure detection system for a power converter, according to the present invention.

FIG. 12 illustrates the tenth embodiment of the failure detection system for a power converter. In this figure, similar reference numerals to those in FIG. 10 denote similar or corresponding elements. The inverter current IA, the load current IL, and the inverter output voltage VS are detected by the current sensor 601, 603, and the voltage sensor 604, respectively, and applied to A/D converters 809a, 809b, and 809c which in turn convert the received signals into a digital form.

The addition function 810 determines the sum of the inverter current IA, the load current IL, and the capacitor current (S·Cp·Vc) obtained by the differentiation and converts the result into an output voltage Ve. The voltage Ve is then applied to the comparison functions 812a and 812b. If Ve=0, the microprocessor 800 concludes that the by-pass switch 6 has no failure, while the microprocessor 800 concludes that the by-pass switch 6 has a failure if a by-pass current IS flows through the by-pass switch 6 and thus Ve≠0. Furthermore, if any one of A/D converters 809a, 809b, and 809c has a failure although no by-pass current IS flows through the by-pass switch 6, the relationship among currents becomes −IA+S·Cp·Vc+IL≠0 and thus the output voltage becomes Ve≠0. This means that not only the failure of the by-pass switch 6 but also the failure of A/D converters can be detected.

What is claimed is:

1. A failure detection system for a power converter comprising:

a by-pass switch for switching between a first state connecting a power converter to a load and disconnecting a standby power source from the load, and a second state disconnecting the power converter from the load and connecting the standby power source to the load;

a by-pass switch operating circuit for switching the by-pass switch between the first and second states;

first detecting means coupled to the power converter for detecting output current of the power converter and generating a first output signal in response;

an inverting circuit coupled to the first detecting means for inverting the first output signal to produce a second output signal;

second detecting means coupled to the load for detecting a load current and generating a third output signal in response;

first adding means coupled to the inverting circuit and the second detection means for adding the second and third output signals to produce a first sum; and failure judgment means coupled to the first adding means for detecting a failure of the by-pass switch, wherein, if the first sum is outside a predetermined range when the by-pass switch is in the first state, the failure judgment means produces a control signal indicating a failure of the by-pass switch.

2. The failure detection system of claim 1, further comprising:

third detecting means coupled to the power converter for detecting a second output current based on an output voltage of the power converter and generating a fourth output signal in response;

second adding means coupled to the inverting circuit and the first and third detecting means for adding the second, third, and fourth output signals to produce a second sum; and failure judgment means coupled to the second adding means for detecting a failure of the by-pass switch, wherein, if the second sum is outside a predetermined range when the by-pass switch is in the first state, the failure judgment means produces a control signal indicating a failure of the by-pass switch.

3. The failure detection system of claim 1 wherein the adding means includes an operational amplifier having an input terminal and an output terminal, and a feedback resistor connected between the output terminal of the operational amplifier and the input terminal of the operational amplifier, wherein the second and third output signals are applied to the input terminal of the operational amplifier.

4. The failure detection system of claim 3 wherein a bias voltage is applied to the input terminal of the operational amplifier of the adding means, and wherein the failure judgment means determines failure of the operational amplifier if an output signal of the operational amplifier is about zero volts.

5. The failure detection system of claim 1 wherein the failure judgment means combines the output signals of the inverting circuit and the second detecting means at a first node.

6. The failure detection system of claim 5 wherein a bias voltage is applied to the first node, and wherein the failure judgment means determines a failure of the operational amplifier if an output signal of the operational amplifier is about zero volts.

7. The failure detection system of claim 1 further comprising a multiplexer for successively selecting respective output signals of the inverting circuit and the second detecting means and outputting the selected signals; and an analog-to-digital converter for converting the signals selected by the multiplexer into digital signals, wherein the adding means and the failure judgment means comprise a microprocessor.

8. The failure detection system of claim 1 comprising a plurality of analog-to-digital converters, each of the plurality of analog-to-digital converters being coupled to a respective inverting circuit and the second detecting means, each of the plurality of analog-to-digital converters being adapted to converting the second and third output signals into a digital form wherein the adding means and the failure judgment means comprise a microprocessor.

9. A failure detection system for a power converter including a standby power source and a load, the failure detection system comprising:

a by-pass switch for switching between a first state connecting a power converter to a load and disconnecting a standby power source from the load, and a second state disconnecting the power converter from the load and connecting the standby power source to the load;

a by-pass switch operating circuit for switching the by-pass switch between the first and second states;

first detecting means coupled to the power converter for detecting an output current of the power converter and generating a first output signal in response;

an inverting circuit coupled to the first detecting means for inverting the first output signal to produce a second output signal;

second detecting means coupled to the power converter for detecting a second output current based on an output voltage of the power converter and generating a third output signal in response;

adding means coupled to the inverting circuit and the second detecting circuit for adding the second and third output signals to produce a sum; and failure judgment means coupled to the adding means for detecting a failure of the by-pass switch, wherein, if the sum is outside a predetermined range when the by-pass switch is in the first state, the failure judgment means produces a control signal indicating a failure of the by-pass switch.

10. A failure detection system for a power converter including a standby power source coupled to a load comprising:

a filter coupling an output of a power converter and a load;

a by-pass switch for switching between a first state connecting the power converter to the load and disconnecting a standby power source from the load, and a second state disconnecting the power converter from the load and connecting the standby power source to the load;

a by-pass switch operating circuit for switching the by-pass switch between the first and second states;

first detecting means coupled to the power converter for detecting a first output current of the power converter and producing the first output signal in response;

an inverting circuit coupled to the first detecting means for inverting the first output signal to produce a second output signal;

second detecting means coupled to the load for detecting load current flowing through the load and generating a third output signal in response;

third detecting means coupled to the filter for detecting a current flowing through the filter and generating a fourth output signal in response;

fourth detecting means coupled to the filter for detecting a current flowing out of the filter and for generating a fifth output signal;

adding means coupled to the inverting circuit and the second, third, and fourth detecting means for adding the second, third, fourth, and fifth output signals, to produce a sum; and failure judgment means coupled to the adding means for detecting a failure of the by-pass switch, wherein, if the sum is outside a predetermined range when the by-pass switch is in the first state, the failure judgment means produces a signal indicating a failure of the by-pass switch.

11. The failure detection system of claim 10 wherein:

the filter includes a reactor coupled in series with the output of the power converter and a capacitor connected between a load terminal of the reactor and ground;

the third detecting means detects a current flowing through the reactor; and the fourth detecting means detects a current flowing through the capacitor.

12. A failure detection system for a power converter including a standby power source coupled to a load comprising:

a filter coupled between an output of a power converter and a load;

a by-pass switch for switching between a first state connecting a power converter to a load and disconnecting a standby power source from the load, and a second state for disconnecting the power converter from the load and connecting the standby power source to the load;

a by-pass switch operating circuit for switching the by-pass switch between the first and second states;

first detecting means coupled to the power converter for detecting a first output current of the power converter and producing a first output signal in response;

an inverting circuit coupled to the first detecting means for inverting the first output signal to produce a second output signal;

second detecting means coupled to the load for detecting a load current and for generating a third output signal in response;

third detecting means coupled to the filter for detecting a current flowing through the filter and for generating a fourth output signal in response;

fourth detecting means coupled to the filter for detecting a second output current based on an output voltage of the filter and for generating a fifth output signal in response;

adding means coupled to the inverting circuit and the second, third, and fourth detecting means for adding the second, third, fourth, and fifth output signals to produce a sum; and failure judgment means coupled to the adding means for detecting a failure of the by-pass switch, wherein, if the sum is outside of a predetermined range when the by-pass switch is in the first state, the failure judgment means produces a control signal indicating a failure of the by-pass switch.

13. The failure detection system of claim 12 wherein:

the filter includes a reactor coupled in series with the output of the power converter, and a capacitor connected between a load terminal of the reactor and ground;

the third detecting means detects a current flowing through the reactor and the fourth detecting means detects a voltage across the capacitor.

14. The failure detection system of claim 12, wherein the fourth detecting means converts the output voltage of the filter into a current by differentiating the output voltage.

* * * * *